(12) United States Patent
Poberezhskiy

(10) Patent No.: US 7,627,058 B2
(45) Date of Patent: *Dec. 1, 2009

(54) ALTERNATING QUADRATURES DIFFERENTIAL BINARY PHASE SHIFT KEYING MODULATION AND DEMODULATION METHOD

(75) Inventor: Yefim Samuilovich Poberezhskiy, Thousand Oaks, CA (US)

(73) Assignee: Teledyne Licensing LLC, Thousand Oaks, CA (US)

( * ) Notice: Subject to any disclaimer, the term of this patent is extended or adjusted under 35 U.S.C. 154(b) by 588 days.

This patent is subject to a terminal disclaimer.

(21) Appl. No.: 11/390,761

(22) Filed: Mar. 28, 2006

(65) Prior Publication Data

US 2007/0230619 A1 Oct. 4, 2007

(51) Int. Cl.
*H04L 27/20* (2006.01)
*H04L 27/22* (2006.01)
(52) U.S. Cl. ..................... 375/308; 375/330
(58) Field of Classification Search .......... 375/206, 375/223, 279, 296, 302, 308, 322, 330; 332/103
See application file for complete search history.

(56) References Cited

U.S. PATENT DOCUMENTS

| | | | |
|---|---|---|---|
| 5,140,613 A * | 8/1992 | Birgenheier et al. | 375/308 |
| 5,148,127 A | 9/1992 | Cheon | |
| 5,157,693 A * | 10/1992 | Lemersal et al. | 375/308 |
| 5,377,229 A * | 12/1994 | Wilson et al. | 375/223 |
| 5,491,457 A | 2/1996 | Feher | |
| 5,604,770 A * | 2/1997 | Fetz | 375/296 |
| 6,118,827 A * | 9/2000 | Wynn | 375/273 |
| 6,320,842 B1 * | 11/2001 | Mochizuki | 370/206 |

OTHER PUBLICATIONS

B. Sklar, Digital Communications, Fundamentals and Applications, second edition, Prentice Hall PTR, Upper Saddle River, NJ, 2001, pp. 194-197.
J. G. Proakis, Digital Communications, fourth edition, McGraw-Hill, New York, New York, 2001, pp. 272-276.
Fuqin Xiong, Digital Modulation Techniques, Artech House, Boston/London, 2000, pp. 129-136 and 160-170.
E. A. Lee and D. G. Messerschmitt, Digital Communications, second edition, Kluwer Academic Publishers, Boston/Dordrecht/London, 2001, pp. 402-406.
H. Yazdani, K. Feher, and W. Steenaart, "Constant Envelope Bandlimited BPSK Signal," IEEE TransactionS on CommunicationS, vol. COM 28, No. 6, pp. 889-897, Jun. 1980.
H. Mehdi & K. Feher, "FBPSK, Power and Spectrally Efficient Modulation for PCS and Satellite Broadcasting Applications," IEEE Transactions on Broadcasting, vol. 42, No. 1, Mar. 1996, pp. 27-32.

* cited by examiner

*Primary Examiner*—Khanh C Tran

(57) ABSTRACT

A method of performing alternating quadratures differential binary phase shift keying modulation involves limiting phase changes between adjacent in time modulator output symbols to ±90°, and transmitting modulator input data by 0° and 180° phase differences between non-adjacent in time modulator output symbols.

11 Claims, 14 Drawing Sheets

Block diagram of the sync sequence generator and modulator with separate format conversion and differential polarity modulation of the same parity 2-bit symbols in the *I* and *Q* channels (the 1st embodiment).

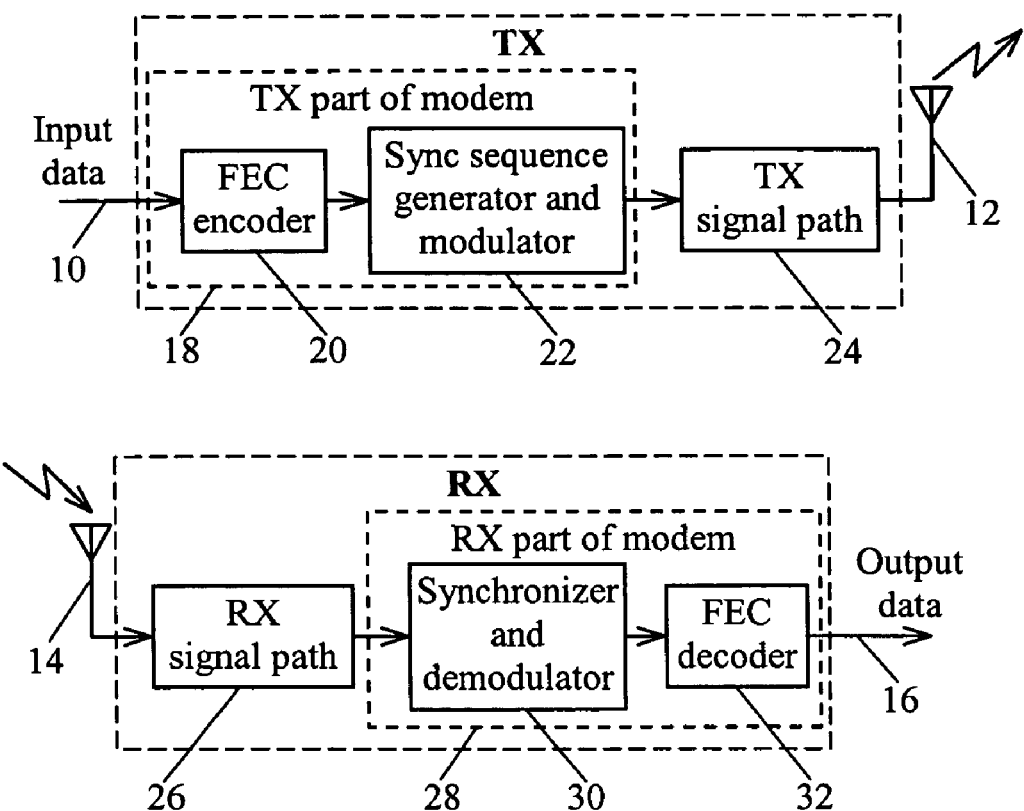
Figure 1. Simplified block diagram of a communication system
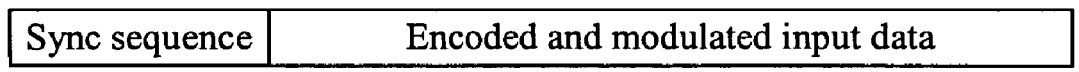
Figure 2. Structure of a burst transmission

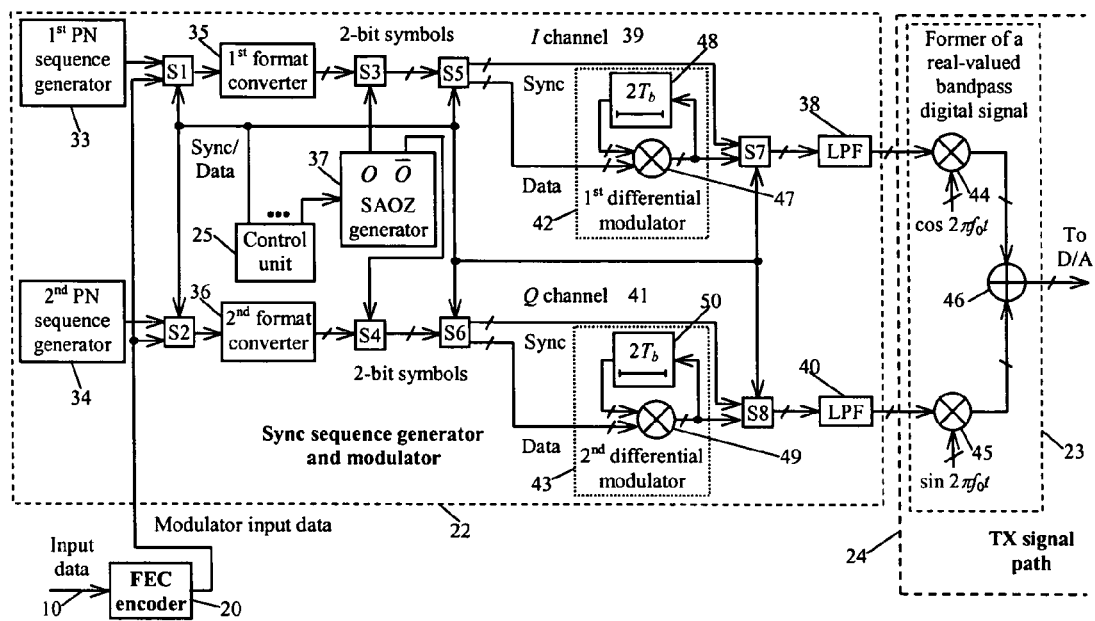
Figure 3. Block diagram of the sync sequence generator and modulator with separate format conversion and differential polarity modulation of the same parity 2-bit symbols in the $I$ and $Q$ channels (the $1^{st}$ embodiment).

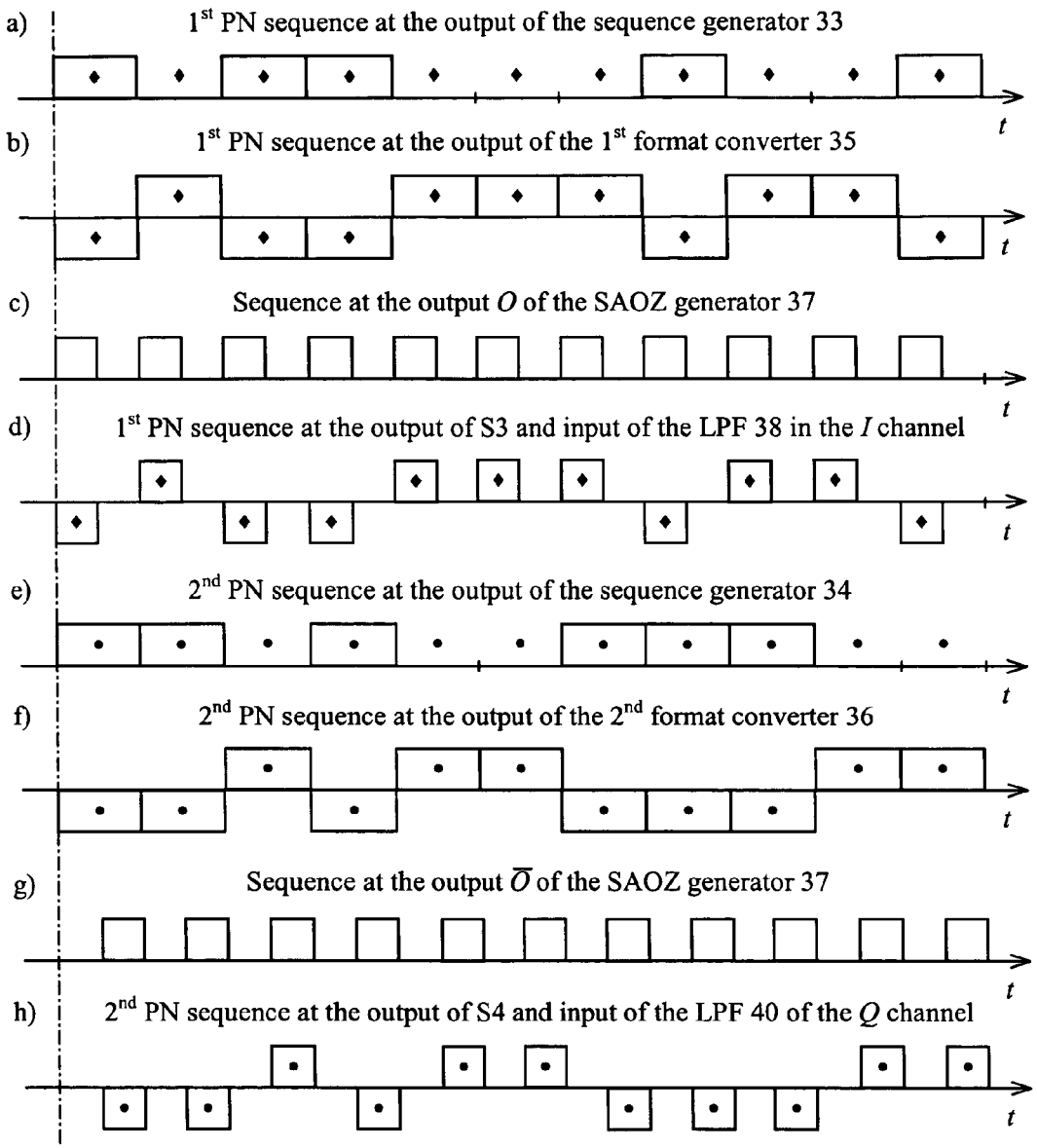
Figure 4. Timing diagrams illustrating operation of the 1st embodiment in the synchronization mode

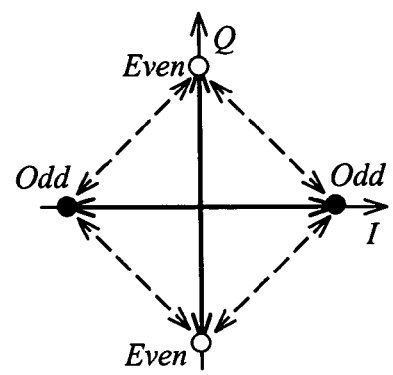
Figure 5. Signal constellation corresponding to the 1st embodiment of sync sequence generation and modulation.

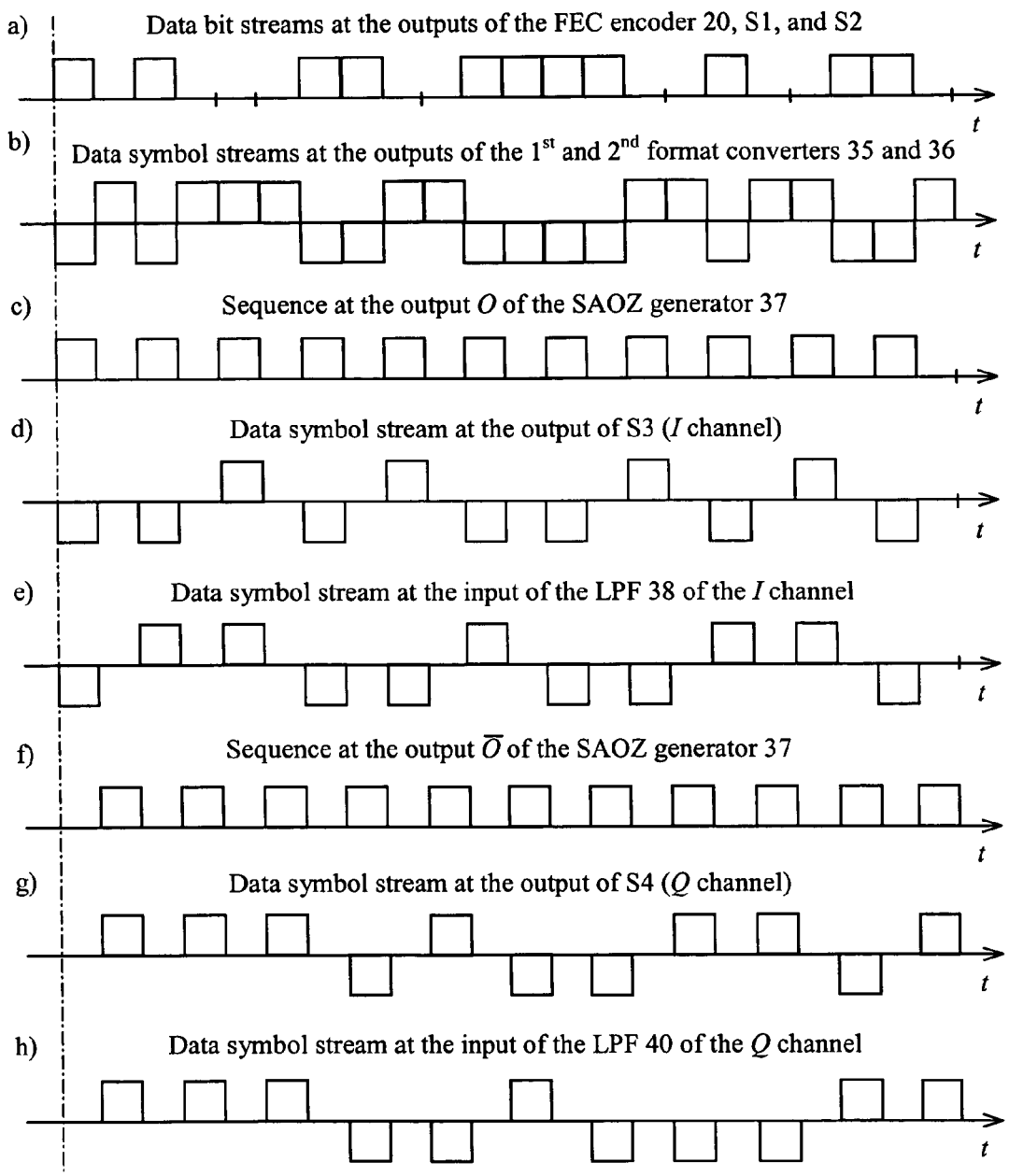
Figure 6. Timing diagrams illustrating operation of the 1st embodiment in the data transmission mode.

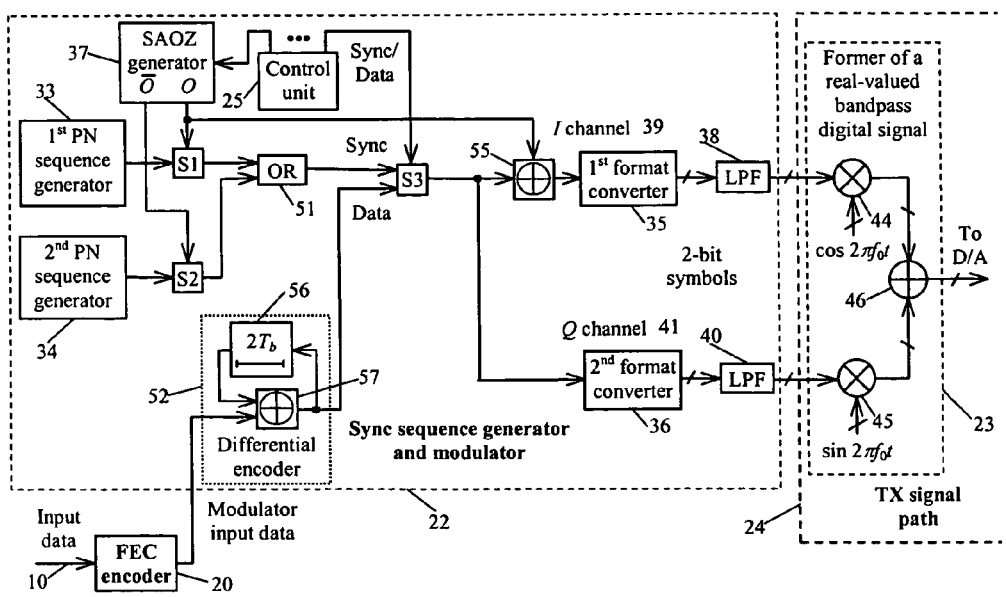
Figure 7. Block diagram of the sync sequence generator and modulator with joint differential encoding of the same parity modulator input data bits for the $I$ and $Q$ channels and separate format conversion in these channels (the $2^{nd}$ embodiment).

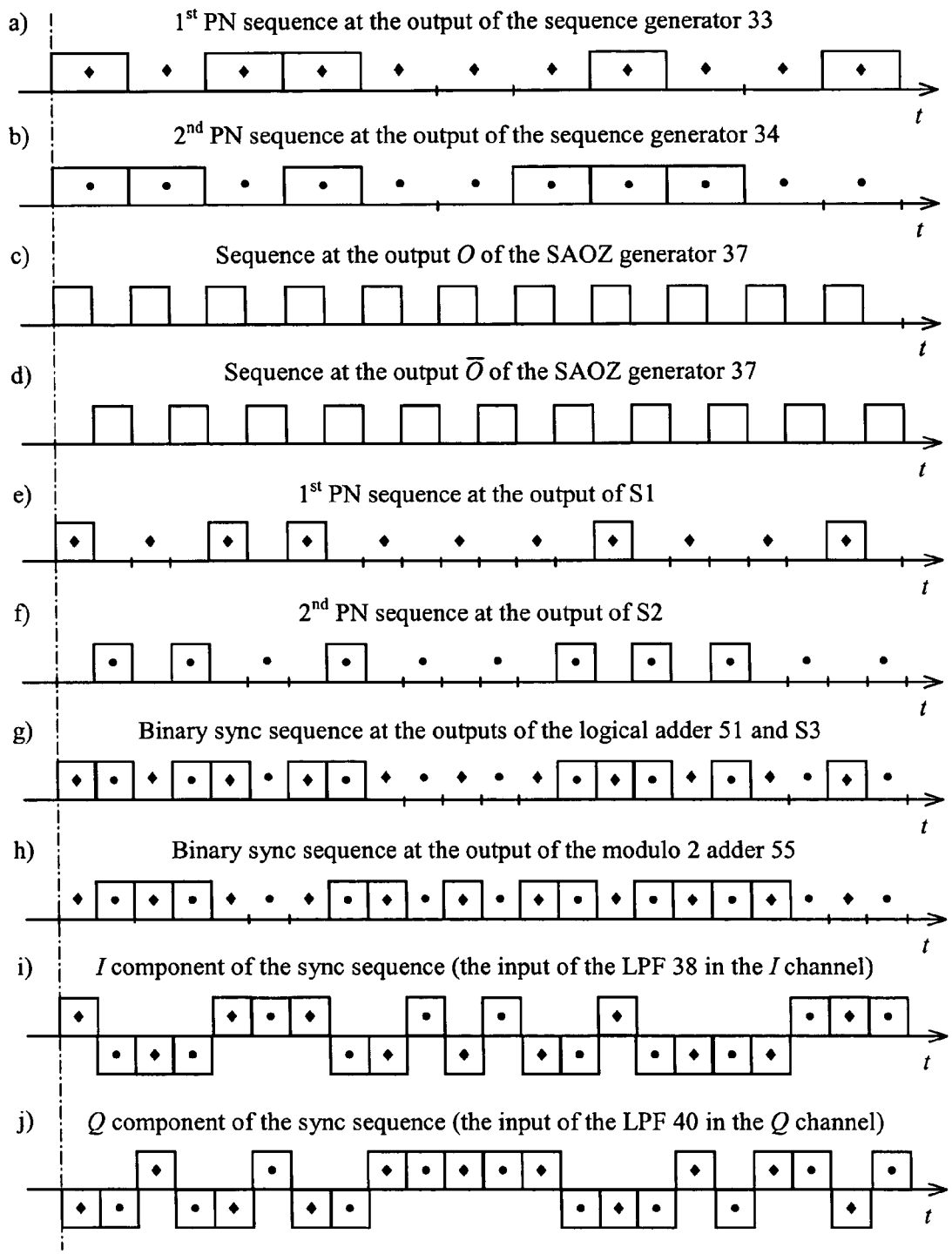
Figure 8. Timing diagrams illustrating operation of the 2$^{nd}$ embodiment in the synchronization mode.

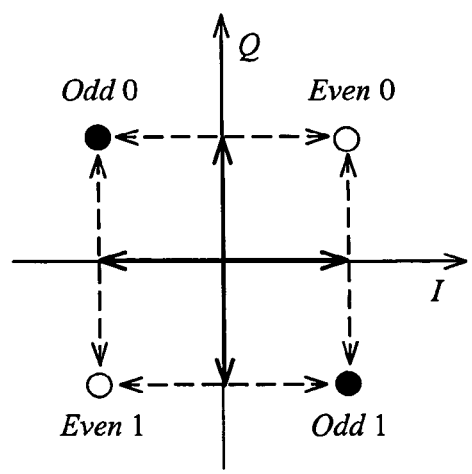
Figure 9. Signal constellation corresponding to the 2$^{nd}$ embodiment of sync sequence generation and modulation.

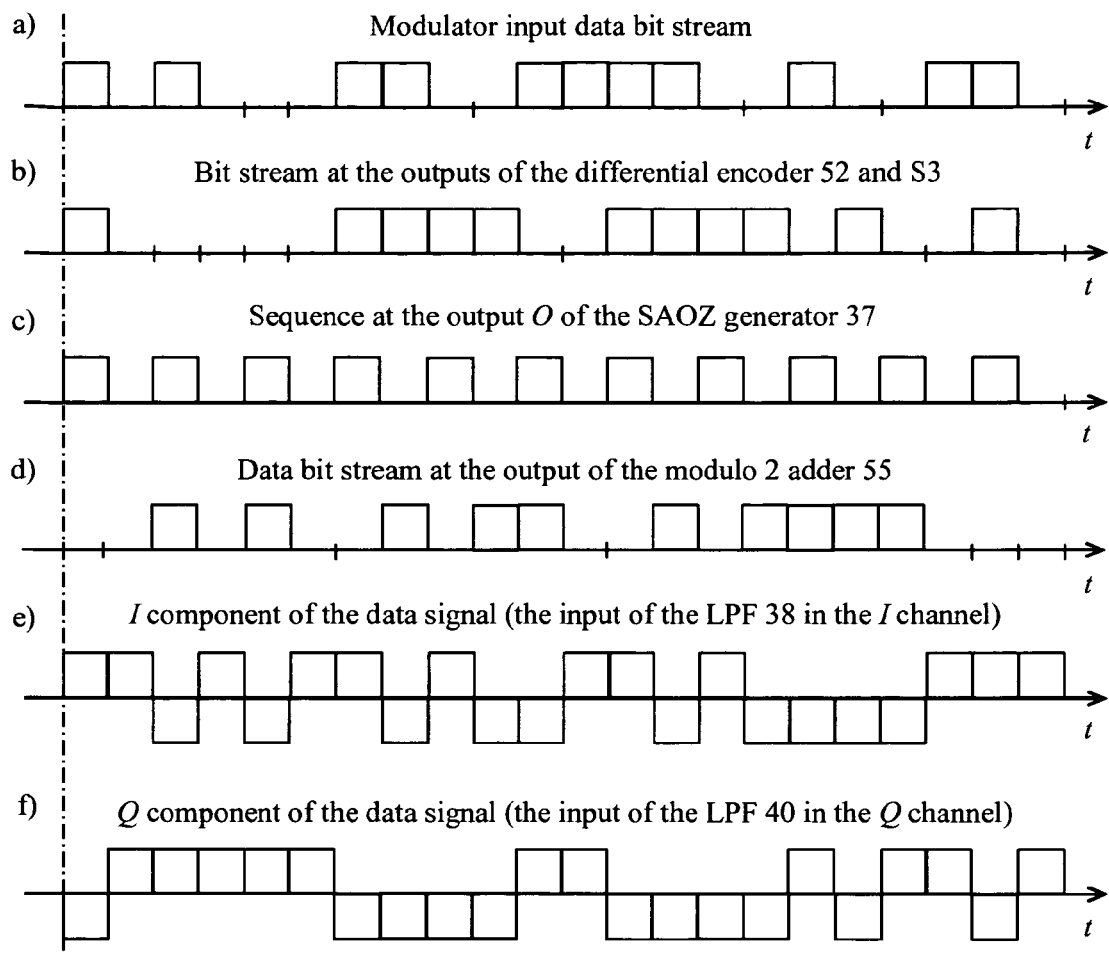
Figure 10. Timing diagrams illustrating operation of the 2nd embodiment in the data transmission mode.

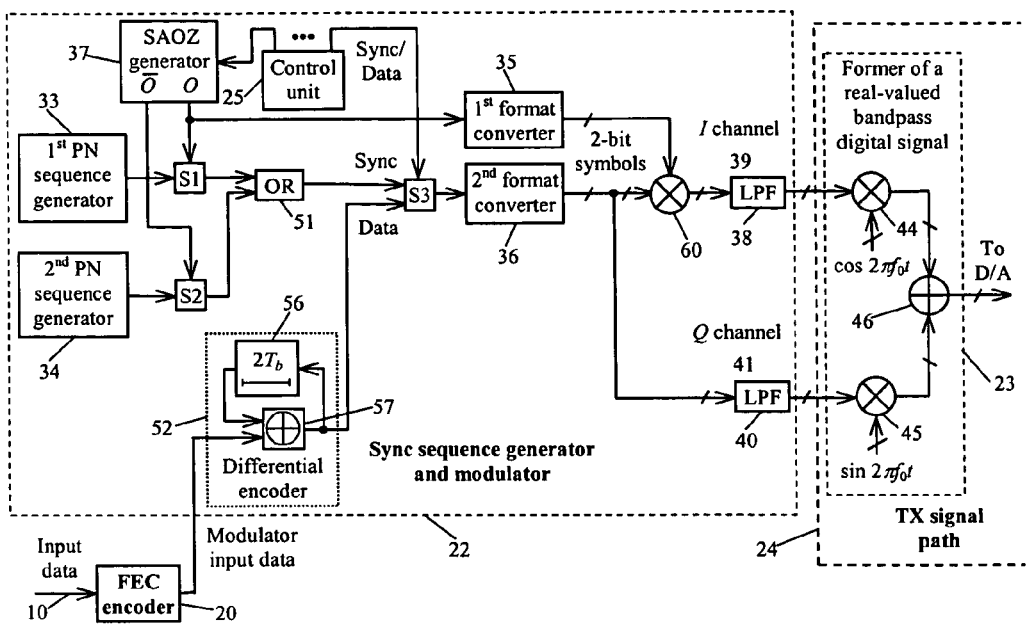
Figure 11. Block diagram of the sync sequence generator and modulator with joint differential encoding of the same parity modulator input data bits and joint format conversion for $I$ and $Q$ channels (the 3$^{rd}$ embodiment).

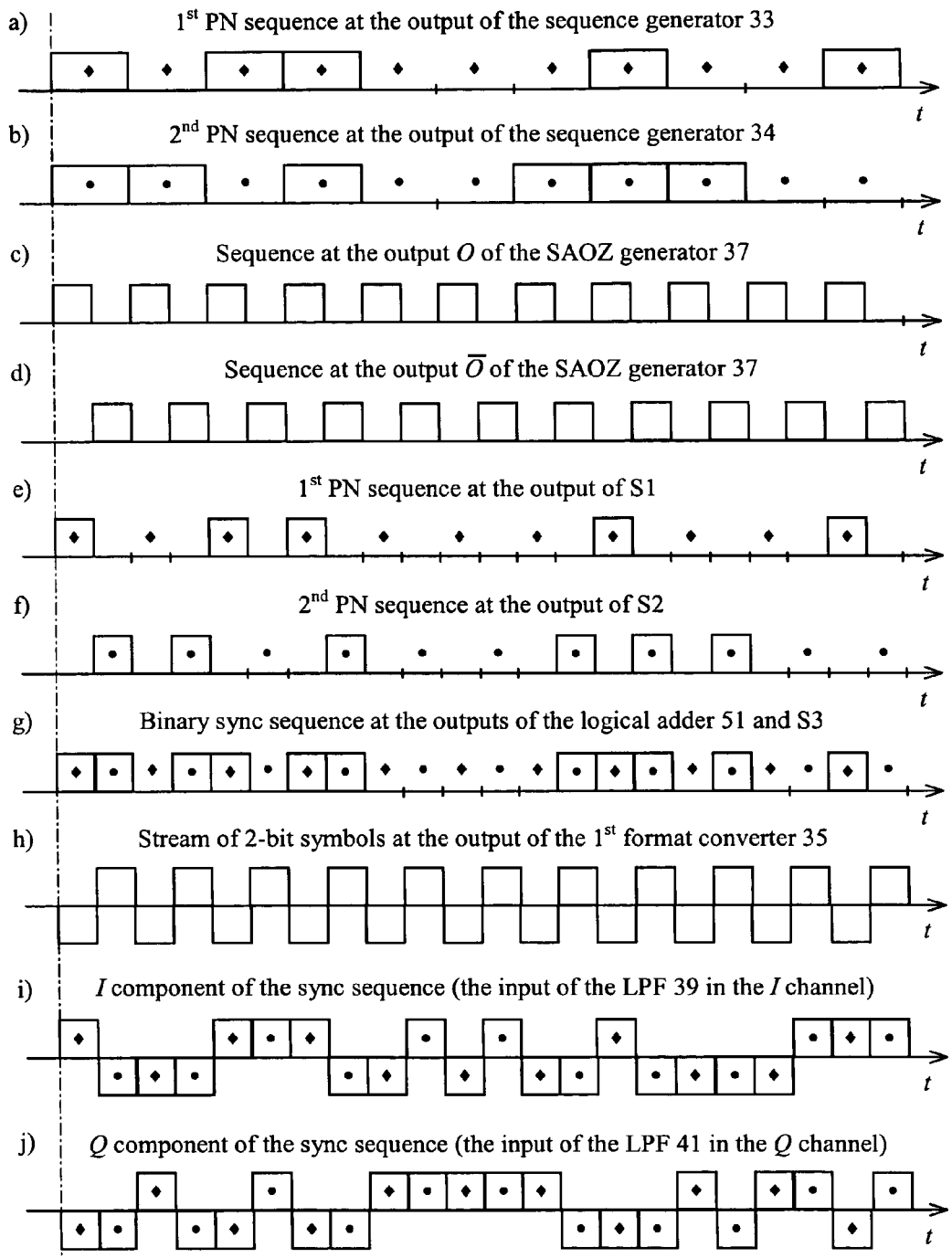
Figure 12. Timing diagrams illustrating operation of the 3rd embodiment in the synchronization mode.

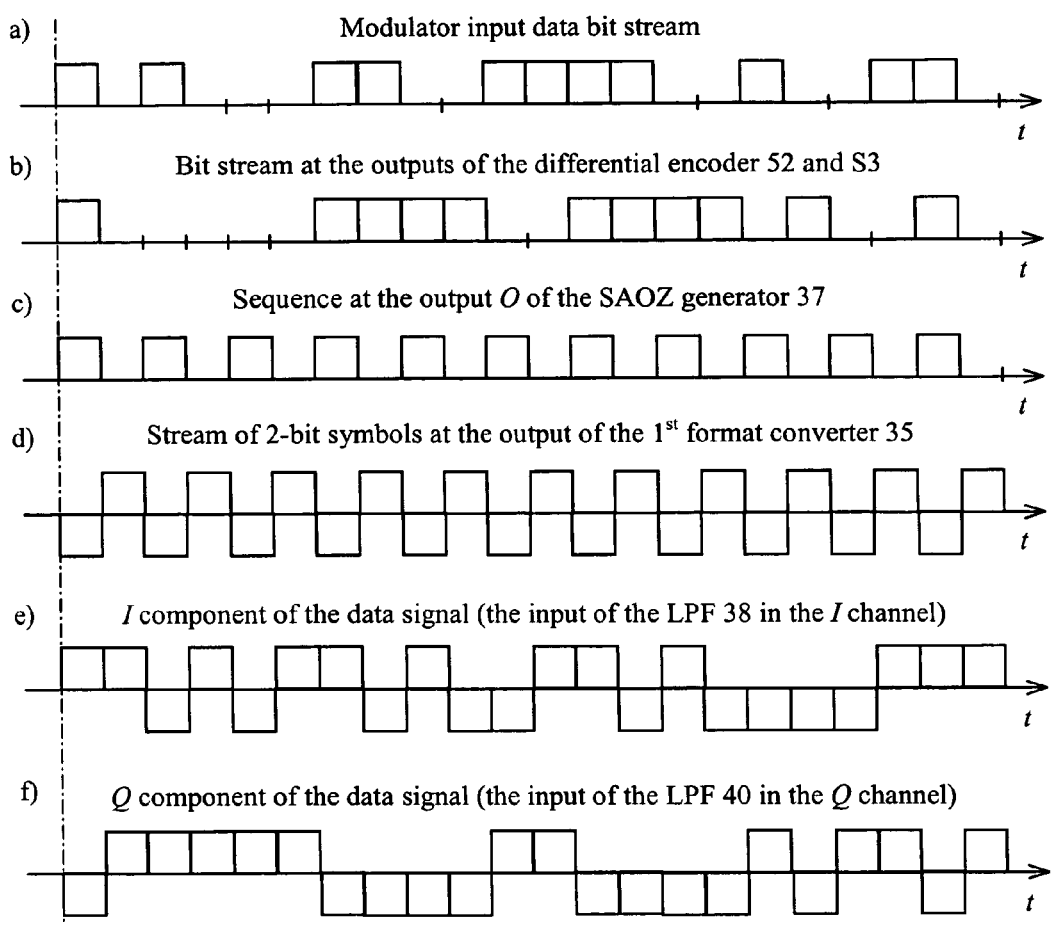
Figure 13. Timing diagrams illustrating operation of the 3rd embodiment in the data transmission mode.

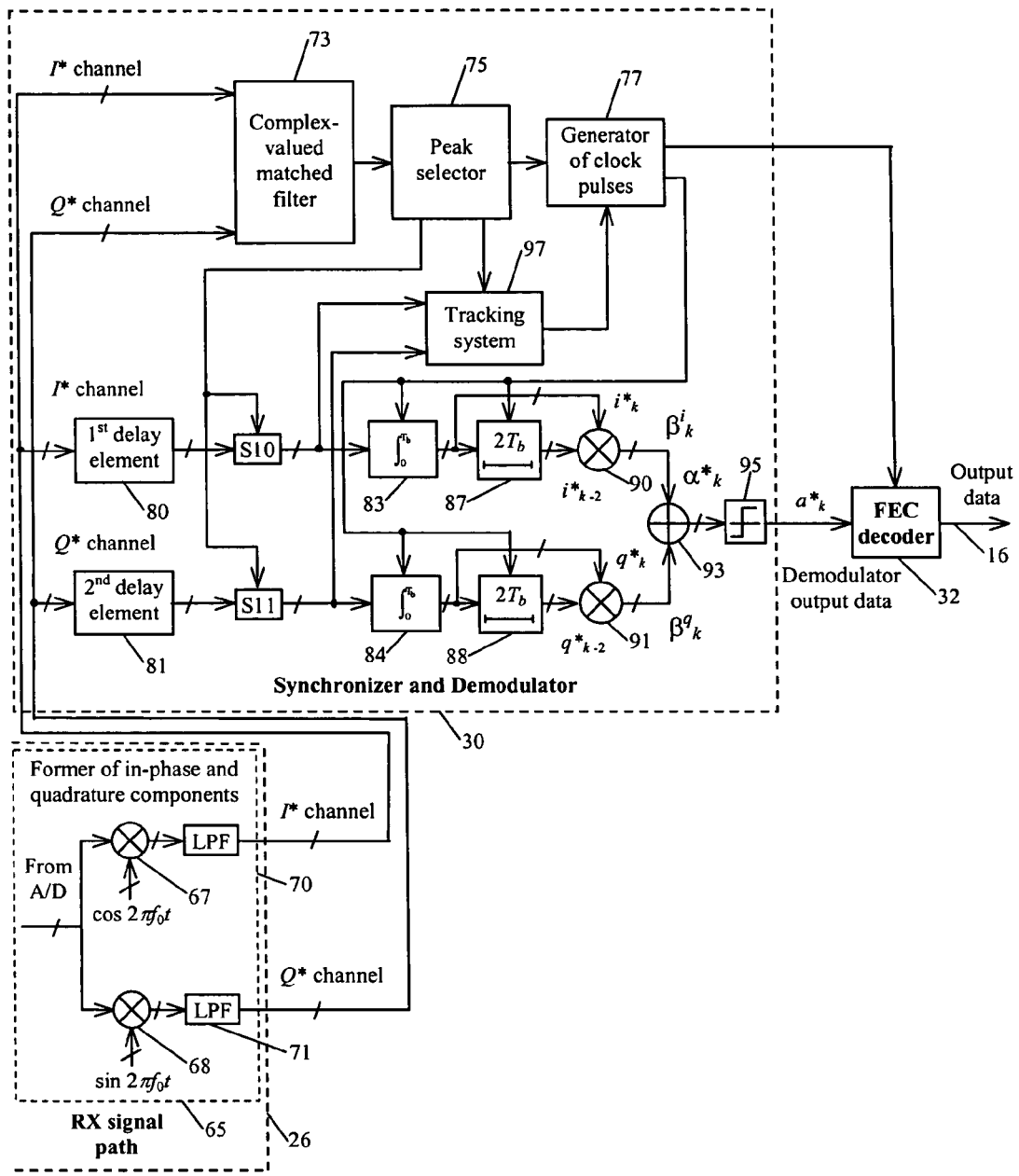
Figure 14. Block diagram of the synchronizer and demodulator.

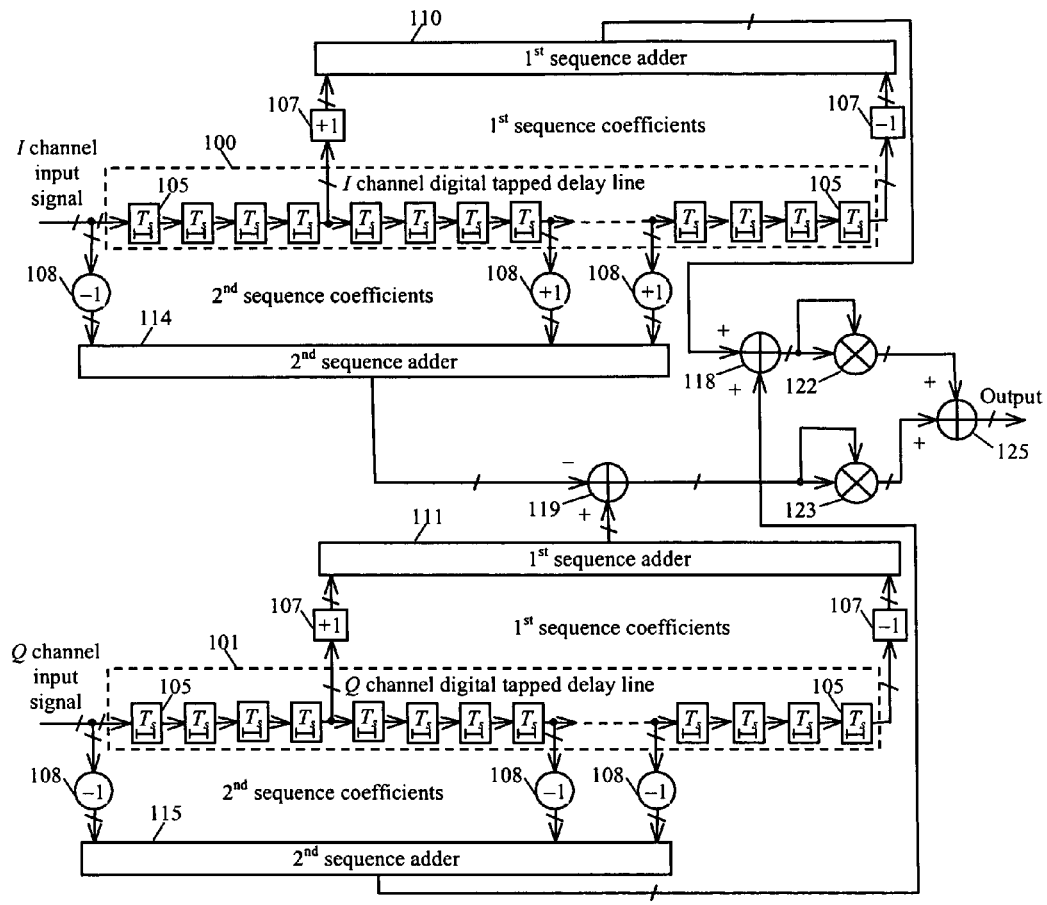
Figure 15. Block diagram of the complex-valued matched filter with direct form of realization of real-valued matched FIR filters.

ALTERNATING QUADRATURES DIFFERENTIAL BINARY PHASE SHIFT KEYING MODULATION AND DEMODULATION METHOD

CROSS REFERENCE TO RELATED APPLICATIONS

Application of Yefim Poberezhskiy, entitled APPARATUS FOR PERFORMING ALTERNATING QUADRATURES DIFFERENTIAL BINARY PHASE SHIFT KEYING MODULATION AND DEMODULATION, filed on even date herewith.

Application of Yefim Poberezhskiy, entitled METHOD AND APPARATUS FOR SYNCHRONIZING ALTERNATING QUADRATURES DIFFERENTIAL BINARY PHASE SHIFT KEYING MODULATION AND DEMODULATION ARRANGEMENTS filed on even date herewith.

TECHNICAL FIELD

This disclosure relates to communication systems, methods, and apparatus. More particularly, this disclosure relates to modulation and demodulation techniques used in communication systems that involve reduced side lobe regeneration and efficient utilization of transmitter power. This disclosure also relates to synchronization schemes for such communications systems, methods, and apparatus.

BACKGROUND

In many communication systems, for example, in systems using frequency hopping, time division multiple access (TDMA), or fast transmissions of short messages, data are transmitted in bursts. In these and similar cases, noncoherent demodulation is preferable because it allows radical reduction of synchronization time and complexity. Reduction of synchronization time and complexity increases overall energy efficiency of a communication system. Noncoherent demodulation is also advantageous when simple system implementations are required.

High overall energy efficiency in a communication system is always desirable, and it is absolutely necessary in systems using battery-powered radios. The overall energy efficiency is determined by several factors. The first factor is the amount of time it takes for the transmitter and the receiver to be synchronized. Shorter synchronization times mean more time can be spent for the transmission of data. This factor is especially important for communication systems using burst transmissions. The second factor is the level of circuit complexity needed to implement the chosen modulation/demodulation method. Simple circuit design contributes to overall energy efficiency because it reduces power consumption of a transmitter and especially a receiver. This factor is exceptionally important for short-distance communications where the power of a transmitted signal is comparable with or even lower than power consumption of the receiver. The third factor is noise immunity of a modulation/demodulation method used in the system. High noise immunity reduces the energy necessary for transmission of given amount of information with required reliability. The fourth factor is efficiency of transmitter power utilization provided by the modulation/demodulation method. High efficiency of transmitter power utilization lowers the power consumption required for given transmitted power. Other factors that influence overall energy efficiency of a communication system are not related to the modulation/demodulation methods. Therefore, they are not considered here.

Thus, there is a great need for a modulation/demodulation technique that is immune to noise and interference, efficiently uses transmitter power, and is simple to implement. Taking into account that noncoherent demodulation reduces synchronization time and complexity, such a method will maximize overall energy efficiency of a communication system because it will improve all four factors that determine this efficiency.

Differential binary phase shift keying (DBPSK) is the most noise immune binary modulation in additive white Gaussian noise (AWGN) channels that allows noncoherent demodulation [1-4]. It also allows the simplest realization of the modulators and noncoherent demodulators. Comparison of DBPSK with M-ary modulation techniques that allow non-coherent demodulation shows the following. When noncoherent demodulation is used, DBPSK is much more noise immune than any M-ary phase modulation including non-coherently demodulated differential quadrature phase shift keying (DQPSK) and differential offset quadrature phase shift keying (DOQPSK), although it has lower bandwidth efficiency. Non-coherently demodulated DBPSK is more bandwidth efficient than M-ary orthogonal keying, and the difference in bandwidth efficiency between DBPSK and M-ary orthogonal keying increases with the growth of M. At the same time, non-coherently demodulated DBPSK is more noise immune than M-ary orthogonal keying when $M \leq 4$. Only when $M>4$, does M-ary orthogonal keying provide higher noise immunity than non-coherently demodulated DBPSK. DBPSK allows the simplest practical realization compared to all alternative modulation techniques. It also provides the greatest ease and the highest noise immunity of bit synchronization and tracking. Additional advantage of DBPSK is the fact that the difference in noise immunity between noncoherently demodulated DBPSK and coherently demodulated BPSK is insignificant. Thus, the high noise immunity of noncoherent demodulation and synchronization as well as simplicity of realization and implementation are advantages of DBPSK.

The main drawback of DBPSK is inefficient utilization of the transmitter power because of frequency side-lobe regeneration. Indeed, the passage of a filtered conventional DBPSK signal through nonlinear circuits causes significant regeneration of the side-lobes of the signal spectrum. These side lobes can interfere with neighboring channels.

The cause for the side-lobe regeneration is as follows. A bandpass signal modulated by conventional DBPSK has a constant envelope, and its spectrum has significant side lobes. Filtering that suppresses these side lobes radically changes the signal envelope. After this filtering, the envelope starts to go up and down, and 180° phase transitions, which are inherent in conventional DBPSK and BPSK, drive the envelope to zero. Hard-limiting the signal, for example, in a class C amplifier, restores its almost constant envelope at the expense of regeneration of the signal spectrum side lobes and reduction of the noise immunity of the signal reception.

To avoid side-lobe regeneration, all units of the transmitter analog signal path including the transmitter power amplifier (PA) have to be operated in linear mode (for example, class A). However, a linear mode of the transmitter analog signal path (and, first of all, a linear mode of its PA) does not allow efficient utilization of the transmitter power due to a high peak factor of filtered DBPSK and BPSK signals. As a result, the transmitter power cannot be efficiently utilized.

Thus, despite its high noise immunity and simplicity DBPSK cannot provide sufficiently high overall energy efficiency in a communication system due to its inefficient utilization of the transmitter power.

It has to be stated that, although 180° phase transitions between adjacent symbols cause the side-lobe regeneration, the transmission of data by binary signals with opposite phases (antipodal signals) is the reason for high noise immunity of conventional BPSK and DBPSK. Reduction of the phase shift between signals from 180° to 90° radically lowers noise immunity of the modulation, on the one hand, and fundamentally reduces the side-lobe regeneration enabling better utilization of transmitter power, on the other. These competing phenomena do not allow achieving sufficiently high overall energy efficiency of a communication system with conventional BPSK and DBPSK.

Therefore, known methods [5-8] that mitigate regeneration of the signal spectrum side lobes in nonlinear amplifiers are based on providing smooth phase transition from 0° to 180° and vice versa. These methods have two significant drawbacks: (1) they do not allow noise immune noncoherent reception of DBPSK (noncoherent reception of BPSK is impossible), and (2) they cannot be implemented using only digital circuits (in other words, analog and/or mixed signal circuits are required for their implementation).

These methods are not energy efficient for two reasons. First, coherent demodulation requires a much longer synchronization time than noncoherent demodulation. Second, the impossibility of their digital realization increases power consumption and makes unfeasible their implementation as a part of a universal reconfigurable digital modem that enables significant reduction of power consumption in real world applications.

SUMMARY

The problems outlined above are solved through a method, an apparatus, and a system involving the application of DBPSK principles to non-adjacent in time bits in an incoming bit stream. The method, apparatus, and system enable radical increases in overall energy efficiency in communication systems.

Described herein are methods, apparatus, and systems for alternating quadratures DBPSK (AQDBPSK) modulation and demodulation that radically increase overall energy efficiency of a communication system due to the combined effect of efficient utilization of transmitter power, high noise immunity of modulation and demodulation, reduced synchronization time, and simple implementation.

Efficient utilization of transmitter power is achieved by eliminating the cause of side-lobe regeneration in nonlinear analog signal paths. Specifically, 180° phase transitions between adjacent symbols are excluded. Phase transitions between adjacent symbols are limited to ±90°, and these transitions are performed smoothly. The high noise immunity of AQDBPSK is provided by transmitting modulator input data by binary 0° and 180° phase differences between adjacent in time same parity the modulator output symbols and optimal noncoherent demodulation of the received same parity symbols.

Radical reduction of side lobe regeneration allows operation of all amplifiers of the transmitter analog signal path, including power amplifier, in energy efficient nonlinear modes (for example, they can operate as class C amplifiers) without causing interchannel interference.

Noncoherent demodulation significantly reduces synchronization time, thus, lowering the energy required for synchronization and increasing time allocated for data transmission.

Minimum power consumption of the modem and simplicity of its implementation are achieved because the proposed methods of modulation, noncoherent demodulation, and synchronization allow optimal realization using the simplest digital signal processing operations and digital circuits. These methods can easily be implemented in a universal reconfigurable digital modem. This enables significant reduction of power consumption in real world applications.

Thus, the main advantage of the methods, apparatus, and systems according to the invention is enabling very high overall energy efficiency of communication systems. High overall energy efficiency of a communication system is advantageous in all applications, and it is absolutely necessary when battery powered radios (manpack radios, handheld radios, sensor radios, etc) are used in the system. The gain in overall energy efficiency provided by the invention compared to known methods, apparatus, and systems depends on the roll-off factor of pulse shaping low-pass filters (LPFs) at the modulator output: the lower the roll-off factor is, the higher gain that can be achieved. In most situations, this gain is about 6 dB or more.

Fast and reliable synchronization is desirable in any communication system, and it is especially important when data are transmitted in bursts. When transmission time is limited, fast and reliable synchronization radically increases time allocated for data transmission in addition to lowering the energy required for synchronization. The use of noncoherent demodulation instead of coherent demodulation allows at least 4-fold reduction of synchronization time when matched filters are used for synchronization.

Illustrative objects of the invention are methods, apparatus, and systems for alternating quadratures DBPSK (AQDBPSK) modulation and demodulation that have one or more of the following distinctive features.

1. Independent differential binary phase modulation of odd and even data symbols, which is achieved (a) by differential polarity modulation of the 2-bit symbols, corresponding to the same parity input data bits, performed separately in I and Q channels through multiplying the input symbols of a differential modulator by its output symbols delayed by the time equal to the length of two modulator input bits when different parity modulator input data bits are sent to different quadrature channels (the $1^{st}$ embodiment) or (b) by differential encoding of same parity modulator input data bits by modulo 2 summing differential encoder input bits with the encoder output bits delayed by a time equal to the length of two modulator input data bits lengths when all differentially encoded bits are sent to both I and Q channels (the $2^{nd}$ and $3^{rd}$ embodiments).

2. Generation of a synchronization (sync) sequence by alternating two pseudorandom, or pseudonoise (PN) sequences of the same length (number of bits), the same starting time, and the same bit rate, which is two times lower than the input data bit rate.

3. Alternating of the PN sequences by selection of the first half of each bit of the $1^{st}$ PN sequence and the second half of each bit of the $2^{nd}$ PN sequence or vice versa and combining them (a) after passing digital lowpass filters and converting to intermediate frequency in the in-phase (I) and quadrature (Q) channels when different parity bits are sent to different quadrature channels (the $1^{st}$ embodiment) or (b) just after the selection of the appropriate halves of bits when the real valued sync sequence is sent to both I and Q channels (the $2^{nd}$ and $3^{rd}$ embodiments).

4. Selection of the appropriate halves of the PN sequences' bits provided by two switches, one of which operates under control of the direct output of a generator of a sequence of alternating ones and zeros (SAOZ) and another under control of the inverse output of this generator. The bit rate at each output of the SAOZ generator is equal to the modulator input data bit rate.

5. Forming ±90° phase shift between even and odd transmitter output bandpass symbols (a) by sending all 2-bit symbols corresponding to odd bits of the sync sequence and the modulator input data to the I channel and all 2-bit symbols corresponding to even bits of the sync sequence and the modulator input data to the Q channel or vice versa and then by the separate differential polarity modulation of 2-bit symbols in each channel (the $1^{st}$ embodiment), or (b) by sending all bits of the real-valued sync sequence and the same parity differentially encoded data bits to both I and Q channels and then by modulo 2 summing these bits in one of the channels with the SAOZ bits generated with the same bit rate as the modulator input data bits (the $2^{nd}$ embodiment), or (c) by sending all 2-bit symbols corresponding to the bits of the real-valued sync sequence and the same parity differentially encoded data bits to both I and Q channels and then by multiplying these two-bit symbols in one of the channels by 2-bit symbols corresponding to the SAOZ bits generated with the same bit rate as the input data (the $3^{rd}$ embodiment).

6. Demodulation of received complex-valued baseband AQDBPSK signals by separately integrating the signals in I and Q channels during the time equal to the length of the modulator input data bit and multiplying a current output signal of each integrator by its output signal delayed by the time equal to the length of two modulator input bits, summing the products, and making a hard decision about a received symbol by utilizing only the sign of the sum or a soft decision about the received symbol by utilizing both sign and value of the sum.

7. Identifying the sync sequence and synchronizing a demodulator of alternating quadratures differential binary phase shift keying signals by sending a received sync sequence to a complex-valued matched filter, which contains in each of its quadrature channels (I and Q channels) a first real-valued filter matched to the sequence consisting of the selected in the modulator halves of the symbols corresponding to the $1^{st}$ PN sequence and spaces between the adjacent in time halves and a second real-valued filter matched to the sequence consisting of the selected in the modulator halves of the symbols corresponding to the $2^{nd}$ PN sequence and spaces between the adjacent in time halves, and selecting the peak of the squared absolute value of the signal at the complex-valued matched filter output.

The modulation proposed in the invention is called alternating quadratures differential binary phase shift keying (AQDBPSK) because each transmitted symbol is in quadrature with the previous symbol (i.e. phase shift between all adjacent transmitted symbols can be equal only to ±90°), and modulator input data are transmitted by binary 0° and 180° phase differences between same parity modulator output symbols.

BRIEF DESCRIPTION OF THE DRAWINGS

FIG. 1 is a simplified block diagram of an example of a communication system in which the invention is useful.

FIG. 2 shows the structure of an example of a burst transmission handled by the communication system of FIG. 1.

FIG. 3 is a block diagram of a first embodiment of the invention involving a sync sequence generator and modulator of FIG. 1 having separate format conversion and differential polarity modulation of same parity 2-bit symbols in I and Q channels.

FIGS. 4a-4h are timing diagrams illustrating operation of the first embodiment of the invention shown in FIG. 3 when operating in a synchronization mode.

FIG. 5 shows the signal constellation at the output of the apparatus of FIG. 3.

FIGS. 6a-6h are timing diagrams illustrating the operation of the first embodiment of the invention shown in FIG. 3 when operating in a data transmission mode.

FIG. 7 is a block diagram of a second embodiment of the invention involving a sync sequence generator and modulator of FIG. 1 having joint differential encoding of same parity input data bits for the I and Q channels and separate format conversions in these channels.

FIGS. 8a-8j are timing diagrams illustrating operation of the second embodiment of the invention shown in FIG. 7 operating in a synchronization mode.

FIG. 9 shows the signal constellation at the output of the apparatus of FIG. 7.

FIGS. 10a-10f are timing diagrams illustrating the operation of the second embodiment of the invention shown in FIG. 7 when operating in a data transmission mode.

FIG. 11 is a block diagram of a third embodiment of the invention involving a sync sequence generator and modulator of FIG. 1 having joint differential encoding of same parity input data bits and joint format conversion for I and Q channels.

FIGS. 12a-12j are timing diagrams illustrating operation of the third embodiment of the invention shown in FIG. 11 operating in a synchronization mode.

FIGS. 13a-13f are timing diagrams illustrating the operation of the third embodiment of the invention shown in FIG. 11 when operating in a data transmission mode.

FIG. 14 shows an embodiment of a synchronizer and demodulator in accordance with this invention.

FIG. 15 shows an embodiment of a complex-valued matched filter with direct form of realization of real-valued matched FIR filters in the synchronizer and demodulator in accordance with this invention.

DETAILED DESCRIPTION

A simplified block diagram of a communication system is shown in FIG. 1. The communication system comprises a transmitter TX and receiver RX. Input data from line 10 enter the transmitter TX where they are processed and converted into a radio frequency (RF) signal radiated by a transmitting antenna 12. In the transmitter TX, the uncoded data from line 10 are first processed by a transmit part 18 of a modem, comprising a forward error correction (FEC) encoder 20 in series with a sync sequence generator and modulator 22. Then, the output signal of the transmit part 18 of a modem is processed by a transmit signal path 24 where the RF signal is formed and amplified, before being radiated by the transmitting antenna 12. The RF signal radiated from the transmitting antenna 12 is received by a receiving antenna 14 in the receiver RX shown in FIG. 1. The receiver RX processes the signal received by antenna 14 and finally produces demodulated and decoded output data that are sent to line 16. The output data correspond to the input data on line 10. The signal received by antenna 14 is processed in a receive signal path 26 and a receive part 28 of a modem comprising a synchronizer and demodulator 30 and an FEC decoder 32, before it is sent to the line 16.

When bandpass analog signal reconstruction is performed in the transmitter TX, the TX signal path 24 includes digital circuits that form a bandpass signal; a digital-to-analog converter (D/A); analog blocks that perform frequency conversion, filtering, preliminary amplification, and level control of analog signals; and a power amplifier (PA). The RX signal path 26 of the receiver RX with bandpass sampling includes preselector; analog blocks that perform frequency conversion, amplification, filtering, and gain control; analog-to-digital converter (A/D); and a digital former of in-phase (I) and quadrature (Q) components. Frequency synthesizers, reference oscillators, and some auxiliary blocks are not shown in FIG. 1.

The transmitter TX sends burst transmissions to the receiver RX. Each burst transmission comprises two components, a synchronization sequence and data. During a synchronization mode, generation and pulse shaping filtering of a complex-valued baseband digital sync sequence is performed in the sync sequence generator and modulator 22 (the TX part 18 of the modem). In the TX signal path 24, this complex-valued baseband digital sync sequence is converted into a real-valued bandpass digital signal, translated into the analog domain, transferred to a required radio frequency (RF), filtered, amplified, and finally transmitted. In the RX signal path 26, the sum of a received real-valued bandpass analog signal corresponding to the sync sequence, noise, and interference is amplified, filtered, converted to an intermediate frequency (IF), translated into the digital domain, and digitally converted into a complex-valued baseband digital signal. This complex-valued baseband digital signal is used in the synchronizer and demodulator 30 (the RX part of the modem) for bit, word, and frame synchronization of the communication system.

During the data transmission mode, the FEC encoder 20 in the TX part 18 of the modem performs forward error correction (FEC) encoding of data that contains header, message, and auxiliary information. The bits from the output of the FEC encoder 20 are input data of the sync sequence generator and modulator 22. For conciseness, these data are called "modulator input data" in the description below. After modulation in the sync sequence generator and modulator 22, a complex-valued baseband digital signal that represents the encoded and modulated data enters the TX signal path 24. Signal processing within both TX and RX signal paths 24 and 26 is the same for the synchronization and data transmission modes. In the RX part 28 of the modem, a complex-valued baseband digital signal is demodulated in the synchronizer and demodulator 30 and then decoded in the FEC decoder 32. The synchronizer and demodulator 30 also includes tracking system that maintains time alignment between incoming signal and internally generated clock pulses.

The structure of a burst transmission comprising a sync sequence followed by encoded and modulated input data is shown in FIG. 2.

This invention can be used with virtually any method of encoding/decoding and with any architecture of TX and RX signal paths. The architectures of the TX signal path with bandpass reconstruction and RX signal path with bandpass sampling are briefly described above only because they usually allow achieving the best performance with any types of modulation and encoding.

There are three preferable embodiments of the modulation and sync sequence generation in the invention. Since all the embodiments send identical signals to the receiver input, the same demodulation method can be used in the RX part of modem for all of these embodiments.

During a synchronization mode, a sync sequence is generated by alternating two pseudonoise (PN) sequences in all the embodiments. The PN sequences have the same length (number of bits), the same starting time, and the same bit rate equal to 0.5R, where R is the modulator input data bit rate. No data enters the sync sequence generator and modulator 22 in this mode.

During the data transmission mode, modulator input data enters the sync sequence generator and modulator 22 with bit rate R. Consequently, the length of each modulator input data bit is equal to $T_b=1/R$.

The $1^{st}$ Embodiment of Sync Sequence Generation and Modulation

The distinctive features of this embodiment of sync sequence generation and modulation compared to other embodiments are separate format conversion and differential polarity modulation of the same parity 2-bit symbols in in-phase I and quadrature Q channels.

FIG. 3 is a block diagram that illustrates the structure and operation of the sync sequence generator and modulator 22 of this embodiment. Besides the sync sequence generator and modulator 22, FIG. 3 shows the FEC encoder 20 and an input block 23 of the TX signal path 24. They are shown to clarify the succession of signal processing in the transmitter TX. At the same time, as mentioned above, the proposed AQDBPSK modulation can be combined with any method of encoding/decoding and with any architecture of the TX signal path 24. In the sync sequence generator and modulator 22, switches S1, S2, S5, S6, S7, and S8, operated by a control unit 25 provide transition from the synchronization mode to the data transmission mode and vice versa.

During the synchronization mode, $1^{st}$ and $2^{nd}$ PN sequences are generated by a first PN sequence generator 33 and a second PN sequence generator 34. These sequences can be linear or nonlinear, uniform or concatenated depending on the application. In all cases, they should have good autocorrelation and other pseudo-noise properties. As mentioned above, the sequences should have the same length (number of bits), and their generation should start simultaneously. Their bit rate should be 0.5R, i.e. it should be half the modulator input data bit rate R.

The timing diagrams illustrating operation of the $1^{st}$ embodiment in the synchronization mode are shown in FIGS. 4a-4h. The first 11 bits of the $1^{st}$ and $2^{nd}$ PN sequences are depicted in FIG. 4a and FIG. 4e, respectively. The bits of the $1^{st}$ PN sequence are marked by rhombuses, while the bits of the $2^{nd}$ PN sequence are marked by circles. The length of each bit of both PN sequences is equal to $2T_b$.

The $1^{st}$ and $2^{nd}$ PN sequences, generated throughout the synchronization mode, enter $1^{st}$ and $2^{nd}$ format converters 35 and 36 through switches S1 and S2, respectively. In these format converters 35 and 36, input bits (ones and zeros) are mapped into two-bit symbols according to the following rule: 1→−1 and 0→1. The 2-bit symbols at the outputs of the $1^{st}$ and $2^{nd}$ format converters 35 and 36 corresponding to the first 11 bits of the $1^{st}$ and $2^{nd}$ sequences are shown in FIGS. 4b and 4f, respectively.

2-bit symbols from the output of the $1^{st}$ format converter 35 enter switch S3 controlled by signals from the direct output O of the generator 37 of a sequence of alternating ones and zeros (SAOZ). The SAOZ generator 37 is a very simple unit. It can be realized using any frequency divider that forms an output square wave with levels 1 and 0. The timing diagram of the signal at the output O is shown in FIG. 4c. As a result of the switch S3 operation, only the first half of each 2-bit symbol passes through switch S3 (see FIG. 4d). After passing through switches S5 and S7, the first halves of 2-bit symbols of the $1^{st}$ PN sequence enter the pulse-shaping lowpass filter (LPF) 38 of the in-phase (I) channel 39. The filter 38 suppresses the side lobes of the signal spectrum, minimizes intersymbol interference, and performs interpolation that increases the sampling frequency $f_s$.

2-bit symbols from the output of the $2^{nd}$ format converter 36 enter switch S4 controlled by signals from the inverse output $\overline{O}$ of the SAOZ generator 37. The timing diagram of the signal at the output $\overline{O}$ is shown in FIG. 4g. Therefore, only the second half of each 2-bit symbol can pass through switch S4 (see FIG. 4h). After passing through switches S6 and S8, the second halves of 2-bit symbols of the $2^{nd}$ PN sequence enter the pulse-shaping LPF 40 of the quadrature (Q) channel 41. This filter carries out the same functions as the LPF 38 in the I channel 39.

During the synchronization mode, the $1^{st}$ and $2^{nd}$ differential modulators 42 and 43 do not operate and are disconnected from other units by switches S5, S6, S7, and S8 (see FIG. 3).

Thus, the $1^{st}$ and $2^{nd}$ PN sequences at the input of the LPFs 38 and 40 are I and Q components of the complex-valued baseband sync sequence. They are represented by 2-bit symbols of length $T_b$ corresponding to the bits of the PN sequences and spaces (see FIGS. 4d and 4h). 2-bit symbols corresponding to the bits of the PN sequences can be equal only 1 or −1, and all 2-bit symbols corresponding to the spaces are equal to 0. Each 2-bit symbol corresponding to a space in the I channel 39 coincides with a 2-bit symbol corresponding to a bit of the PN sequence in the Q channel 41 and vice versa.

As a result of processing in the LPFs 38 and 40, each 2-bit symbol is transformed into several multibit samples. The transformation allows significant smoothing of the shape of the modulator output signals. Due to this smoothing, the tails of the symbols cover the spaces. However, the peak of each symbol at the output of the LPF 38 in the I channel 39 approximately coincides with the middle of a space at the output of the LPF 40 in the Q channel 41 and vice versa, because the LPFs 38 and 40 are finite impulse response (FIR) filters.

The outputs of the LPFs 38 and 40 in the I and Q channels 39 and 41 are the outputs of the sync sequence generator and modulator 22. Thus, LPFs 38 and 40 perform digital interpolation and pulse shaping of the modulator output signals. The entire signal processing is digital in the sync sequence generator and modulator 22. The digital baseband symbols from the output of the LPFs 38 and 40 constitute a complex-valued baseband digital sync sequence.

As shown in FIG. 3, this complex-valued baseband digital sync sequence enters the TX signal path 24. As stated above, any architecture of TX signal path 24 can be used in the present invention. The input block 23 of the TX signal path 24 shown in FIG. 3 forms an output signal to be sent to a D/A converter that is a real-valued bandpass digital signal. Such a block 23 is related to architectures with bandpass analog signal reconstruction.

In block 23, the output signal of the LPF 38 in the I channel 39 is multiplied by $\cos 2\pi f_0 t$ in multiplier 44, and the output signal of the LPF 40 in the Q channel 41 is multiplied by $\sin 2\pi f_0 t$, in multiplier 45. Usually, $f_0 = 0.25 f_s$. Such relations between $f_0$ and $f_s$ simplify the multiplications in multipliers 44 and 45. These multiplications are a part of frequency conversion of the baseband signals from the outputs of the LPFs 38 and 40 to an intermediate frequency $f_0$, and simultaneously they provide 90° phase shift between the signals in the I and Q channels 39 and 41. The output signals of the multipliers 44 and 45 are added to each other by adder 46 thus forming a real-valued bandpass digital signal corresponding to the sync sequence constructed of two alternating PN sequences. This real-valued bandpass digital signal enters a digital to analog converter D/A, and, after translation into the analog domain and further analog processing in the TX signal path 24, is transmitted by the antenna 12.

The odd symbols of this signal correspond to the bits of the $1^{st}$ PN sequence processed in the I channel 39, and the even symbols of this signal correspond to the bits of the $2^{nd}$ PN sequence processed in the Q channel 41. Since the phase shift between the I and Q signal components is equal to 90°, only +90° or −90° phase transitions between adjacent symbols are possible. This is illustrated by the signal constellation corresponding to the $1^{st}$ embodiment of sync sequence generation and modulation shown in FIG. 5. In this signal constellation, black circles correspond to odd symbols transmitted over the I channel 39, and white circles correspond to even symbols transmitted over the Q channel 41. Transitions between circles with the same color are impossible because all odd symbols come from the I channel 39, and all even symbols come from Q channel 41.

Thus, only +90° or −90° phase transitions between adjacent symbols of the bandpass signal corresponding to the sync sequence are possible. These ±90° transitions are gradual because the symbols are smoothed in the LPFs 38 and 40 of the I and Q channels 39 and 41. Such a signal can tolerate hard limiting without any significant regeneration of the spectrum side lobes. Therefore, all the amplifiers in the TX signal path 24 including the PA can operate in nonlinear mode (for example, as class C amplifiers) that allows efficient utilization of transmitter power.

During the data transmission mode, input data from line 10 enter the FEC encoder 20. The encoded data from the output of the FEC encoder 20 (modulator input data) enter the sync sequence generator and modulator 22 with bit rate R, and the $1^{st}$ and $2^{nd}$ PN sequences are not generated. The timing diagrams illustrating operation of the $1^{st}$ embodiment in the data transmission mode are shown in FIG. 6. The input data passes through switches S1 and S2 and enters the $1^{st}$ and $2^{nd}$ format converters 35 and 36 (see FIG. 6a). In the format converters 35 and 36, the modulator input data bits (ones and zeros) are mapped into two-bit symbols according to the rule: 1→−1 and 0→1 as shown in FIG. 6b. Each two-bit symbol has the same length $T_b$ as the modulator input data bits.

Switches S3 and S4 under the control of the SAOZ generator 37 extract odd parity symbols from symbol stream at the output of the format converter 35 and even parity symbols from the symbol stream at the output of the format converter 36. The odd parity symbols are sent to the I channel 39 and the even parity symbols are sent to the Q channel 41. The 2-bit symbols from the outputs of the $1^{st}$ and $2^{nd}$ format converters 35 and 36 enter switches S3 and S4, respectively. Switch S3 controlled by signals from the direct output O of the SAOZ generator 37 (see FIG. 6c) allows passage only odd symbols (see FIG. 6d). At the same time, switch S4 controlled by signals from the inverse output O of the SAOZ generator 37 (see FIG. 6f) allows passage only even symbols (see FIG. 6g). As shown in FIG. 6d, the stream of 2-bit symbols from the output of switch S3 in the I channel 39 consists of odd symbols corresponding to the modulator input data bits (these symbols can be equal to 1 or −1) and even symbols corresponding to the spaces (these symbols are equal to 0). At the same time, as shown in FIG. 6g, the stream of 2-bit symbols from the output of switch S4 in the Q channel 41 consists of even symbols corresponding to the modulator input data bits (these symbols can be equal to 1 or −1) and odd symbols corresponding to the spaces (these symbols are equal to 0).

Consequently, all even symbols in the I channel 39 and all odd symbols in the Q channel 41 are equal to 0. Each symbol in any channel has the same length equal to $T_b$.

The 2-bit symbols from the output of switch S3 in the I channel 39 and from the output of switch S4 in the Q channel 41 separately undergo differential polarity modulation in first and second differential polarity modulators 42 and 43. Denoting 2-bit symbols at the input of a differential modulator by $a_k$ and 2-bit symbols at its output by $b_k$, where k is a symbol number, the differential polarity modulation is as follows:

$$b_1=a_1, b_2=a_2, \text{ and } b_k=a_k \times b_{k-2} \text{ for } k \geq 3.$$

In both I and Q channels 39 and 41, all symbols $b_k$ for $k \geq 3$ are formed by the $1^{st}$ and $2^{nd}$ differential modulators (see FIG. 3). These differential modulators are identical and each of them comprises a time delay element, for example, a digital memory, intended to provide $2T_b$ delay for its output symbols and a multiplier, for example, a digital multiplier. Specifically, the first differential modulator 42 comprises a multiplier 47 and a time delay element 48 that provides a $2T_b$ time delay between its input and output. The multiplier 47 has two inputs and an output. One input of the multiplier 47 is connected to the output of the format converter 35 coming through switches S3 and S5. The other input of the multiplier 47 is connected to the output of the time delay element 48. The output of the multiplier 47 is connected to the input of the time delay element 48 and to the input of switch S7. Similarly, the second differential modulator 43 comprises a multiplier 49 and a time delay element 50 that provides a $2T_b$ time delay between its input and output. The multiplier 49 has two inputs and an output. One input of the multiplier 49 is connected to the output of the format converter 36 coming through switches S4 and S6. The other input of the multiplier 49 is connected to the output of the time delay element 50. The output of the multiplier 49 is connected to the input of the time delay element 50 and to the input of switch S8. The differential modulators 42 and 43 are very simple units because each of their input and output symbols is represented by only two bits and multiplications can be easily performed. Indeed, since 2-bit symbols corresponding to the data bits can be equal only 1 or –1, their product is equal to 1 when the symbols have the same polarity, and it is equal to –1 when they have opposite polarity. When 2-bit symbols corresponding to spaces are multiplied the product is always equal to 0.

The differential modulators 42 and 43 shown in FIG. 3 cannot form symbols $b_1$ and $b_2$. In the I channel 39, $b_1$ corresponds to the $1^{st}$ input data bit, and $b_2$ corresponds to the space. In the Q channel 41, $b_1$ corresponds to the space, and $b_2$ corresponds to the $2^{nd}$ input data bit. To avoid loss of the first two input data bits, switches S5 and S6, operated by control unit 25, pass the first two 2-bit symbols to the differential modulators 42 and 43 and simultaneously to the buses that bypass the differential modulators 42 and 43. Such connections are provided only during the time interval equal to $2T_b$ after the start of the data transmission mode. Just after the end of this time interval, switches S5 and S6 pass 2-bit symbols only to the inputs of the differential modulators 42 and 43.

Thus, during the entire synchronization mode and the time interval equal to $2T_b$ at the beginning of the data transmission mode, switches S7 and S8 connect buses that bypass the differential modulators 42 and 43 to the LPFs 38 and 40 in the I and Q channels 39 and 41, respectively. During the rest of the data transmission mode, switches S7 and S8 connect the outputs of the differential modulators 42 and 43 to the LPFs 38 and 40 in the I and Q channels 39 and 41, respectively. The data symbol stream at the output of switch S7 (I channel) during the data transmission mode is shown in FIG. 6e, and the data symbol stream at the output of switch S8 (Q channel) during this mode is shown in FIG. 6h.

The data symbol streams from the outputs of switches S7 and S8 enter the pulse-shaping LPFs 38 and 40 in the I and Q channels 39 and 41. Comparison of the timing diagrams in FIGS. 6e and 6h with the timing diagrams in FIGS. 4d and 4h shows that signals at the inputs of the LPFs 38 and 40 in the I and Q channels 39 and 41 have the same format in both synchronization and data transmission modes. Therefore, the signal constellation shown in FIG. 5 is equally related to both these modes.

In the data transmission mode, the LPFs 38 and 40 and the block 23 in the TX signal path 24 perform the same processing as in the synchronization mode. As a result of this processing, a real-valued bandpass digital signal corresponding to the input data bits is formed. This signal is translated into the analog domain by a digital to analog converter D/A, and, after further analog processing in the TX signal path 24, is transmitted by the antenna 12.

For the same reason as in the synchronization mode, only +90° or –90° gradual phase transitions between adjacent symbols are possible in the real-valued bandpass digital signal corresponding to the input data bits formed during the data transmission mode. Therefore, all the amplifiers in the TX signal path including the PA can operate in nonlinear mode (for example, as class C amplifiers) that allows efficient utilization of transmitter power. At the same time, the data are transmitted using binary 0° and 180° phase differences between adjacent in time same parity output symbols. This provides high noise immunity of communications in the AWGN channels in addition to efficient utilization of transmitter power.

The order of the operations in the $1^{st}$ embodiment of sync sequence generator and modulator 22 can be changed. For example, modulator input data bits can be converted into 2-bit symbols before separation of the odd and even bits. Selection of the appropriate halves of bits of the $1^{st}$ and $2^{nd}$ PN sequences can be performed before the format conversions. These and some other changes in the order of operation do not influence the system performance.

The $2^{nd}$ Embodiment of Sync Sequence Generation and Modulation

The distinctive features of the $2^{nd}$ embodiment of sync sequence generation and modulation compared to other embodiments are joint differential encoding of the same parity input data bits for the I and Q channels 39 and 41 and separate format conversion at the input of the LPFs 38 and 40 in these channels. Compared to the $1^{st}$ embodiment where ±90° phase transitions between adjacent symbols are achieved due to processing odd symbols in the I channel 39 and even symbols in the Q channel 41 or vice versa, the phase transitions between adjacent symbols in the $2^{nd}$ embodiment are limited to ±90° due to elimination of simultaneous transitions of the symbols' polarity in the I and Q channels 39 and 41, while all symbols are processed in both I and Q channels 39 and 41.

The block diagram that illustrates operation of the sync sequence generator and modulator 22 of this embodiment is shown in FIG. 7. Similar to the block diagram shown in FIG. 3, the block diagram in FIG. 7 contains an FEC encoder 20 and an input block 23 of the TX signal path 24 (this block forms a real-valued bandpass digital signal) in addition to the sync sequence generator and modulator 22, which is directly influenced by this embodiment of the present invention. Transition from synchronization mode to data transmission mode is provided by switch S3 operated by a control unit 25 in FIG. 7.

During the synchronization mode, the $1^{st}$ and $2^{nd}$ PN sequences are generated by the first and second PN sequence generators 33 and 34 in FIG. 7, respectively. Requirements for these sequences and their parameters in the $2^{nd}$ embodiment are the same as those in the $1^{st}$ embodiment. The timing diagrams illustrating operation of the $2^{nd}$ embodiment in the synchronization mode are shown in FIGS. 8a-8j. The first 11 bits of the $1^{st}$ and $2^{nd}$ PN sequences are depicted in FIG. 8a and FIG. 8b, respectively. The bits of the $1^{st}$ PN sequence enter switch S1 controlled by signals from the direct output O of the SAOZ generator 37 (see the timing diagrams of the signal at the output O in FIG. 8c). As a result of the switch S1 operation, only the first half of each bit passes through this switch (see FIG. 8e). At the same time, the bits of the $2^{nd}$ PN sequence enter switch S2 controlled by signals from the inverse output $\overline{O}$ of the SAOZ generator 37 (see the timing diagrams of the signal at the output $\overline{O}$ in FIG. 8d). As a result of the switch S2 operation, only the second half of each bit passes through this switch (see FIG. 8f).

Thus, spaces at the output of switch S1 coincide with the second halves of the $2^{nd}$ PN sequence bits at the output of switch S2, and spaces at the output of switch S2 coincide with the first halves of the $1^{st}$ PN sequence bits at the output of switch S1 (see FIGS. 8e and 8f). The signals from the outputs of switches S1 and S2 are combined in a logical adder 51 (an OR gate). As a result of this combining, the real-valued binary sync sequence (see FIG. 8g) is formed by alternating the $1^{st}$ and $2^{nd}$ PN sequences that have the same length, starting time, and bit rate 0.5R. The real-valued binary sync sequence (see FIG. 8g) enters both I and Q channels 39 and 41 after passing through switch S3 in FIG. 7. The differential encoder 52 does not operate and is disconnected from other units by switch S3 during the synchronization mode.

Although the real-valued binary sync sequence enters both I and Q channels 39 and 41, the sequence is processed differently in these channels. In one of the channels, it is directly sent to the format converter. In another channel, the binary sync sequence is sent to the format converter after modulo 2 adding the sync sequence to a series of alternating ones and zeros from the SAOZ generator 37. In the version of the $2^{nd}$ embodiment shown in FIG. 7, modulo 2 adder 55 is installed prior to the first format converter 35 in the I channel 39 and the direct output O of the SAOZ generator 37 is used. In the Q channel 41, the binary sync sequence is sent directly to the second format converter 36. In principle, modulo 2 adding of the SAOZ to the sync sequence can be carried out in any of the quadrature channels and any of two outputs of the SAOZ generator 37 can be used.

The timing diagram of the binary sync sequence obtained at the output of the modulo 2 adder 55, i.e. at the input of the $1^{st}$ format converter 35 in the I channel is shown in FIG. 8h, while the binary sync sequence at the input of the $2^{nd}$ format converter 36 in the Q channel is reflected by the timing diagram in FIG. 8g. In both format converters 35 and 36, bits are mapped into 2-bit symbols according to the rule: 1→−1 and 0→1. The stream of 2-bit symbols generated at the output of the $1^{st}$ format converter 35 enters the pulse-shaping LPF 38 in the I channel 39 (see FIG. 8i), and the stream of 2-bit symbols generated at the output of the $2^{nd}$ format converter 36 enters the pulse-shaping LPF 40 in the Q channel 41 (see FIG. 8j). The stream of 2-bit symbols shown in FIG. 8i is the I component of the complex-valued baseband digital signal corresponding to the sync sequence, and the stream of 2-bit symbols shown in FIG. 8j is the Q component of this signal. The components are further processed in the pulse-shaping LPFs 38 and 40 of the I and Q channels 39 and 41, respectively. In the $2^{nd}$ embodiment, the LPFs 38 and 40 carry out the same functions as the LPFs 38 and 40 in the $1^{st}$ embodiment.

FIGS. 8i and 8j show that change of the symbol polarity (transitions from 1 to −1 or vice versa) at any boundary between adjacent symbols can happen only in one of the channels 39 or 41. This means that phase transitions between adjacent complex-valued symbols can be only +90° or −90°. Indeed, since 180° phase transitions between adjacent symbols can happen only if both I and Q quadrature components simultaneously change their polarity, such transitions are impossible in this embodiment of the invention.

The signal constellation corresponding to the $2^{nd}$ embodiment of the invention is shown in FIG. 9. Here, white circles correspond to even binary symbols, and black circles correspond to odd binary symbols. As follows from the timing diagrams shown in FIGS. 8i and 8j, transitions between circles with the same color are impossible.

In the $2^{nd}$ embodiment, the block 23 in the TX signal path 24 performs the same processing as in the $1^{st}$ embodiment. As a result of this processing, a real-valued bandpass digital signal corresponding to the complex-valued sync sequence (constructed of two alternating PN sequences) is formed. The signal is translated into the analog domain by a digital to analog converter D/A, and, after further analog processing in the TX signal path 24, is transmitted by antenna 12. Since only ±90° gradual phase transitions between adjacent symbols are possible in the real-valued bandpass digital signal, all the amplifiers in the TX signal path 24 including the power amplifier PA can operate in nonlinear mode (for example, as class C amplifiers). This enables efficient utilization of the transmitter power.

During the data transmission mode, the $1^{st}$ and $2^{nd}$ PN sequences are not generated, and the encoded data from the output of the FEC encoder 20 enter the sync sequence generator and modulator 22 with bit rate R. The timing diagrams illustrating operation of the $2^{nd}$ embodiment in the data transmission mode are shown in FIGS. 10a-10f. The input data (see FIG. 10a) are differentially encoded first by a differential encoder 52.

Denoting bits at the input of a differential encoder 52 by Ck and bits at its output by $d_k$, where k is a bit number, this encoding can be can described as follows:

$$d_1=c_1, d_2=c_2, \text{ and } d_k=c_k \oplus d_{k-2} \text{ for } k \geq 3$$

where ⊕ means modulo 2 summing. Thus, the differential encoder 52 is a very simple unit that contains time delay element 56, for example, a 2-bit memory, and a modulo 2 adder 57. One input of the adder 57 is connected to the output of the FEC encoder 20. The other input of the adder 57 is connected to the output of the time delay element 56. The output of the adder 57 is connected to the input of the time delay element 56 and to the data input of switch S3. The bit stream of differentially encoded input data is shown in FIG. 10b.

After passing through switch S3, this bit stream enters both I and Q channels 39 and 41, where it is processed exactly like the sync sequence (see FIG. 7). In the I channel 39, the bit stream undergoes modulo 2 adding to the sequence of ones and zeros from the inverse output $\overline{O}$ of the SAOZ generator 37 (see FIG. 10c), and the result (see FIG. 10d) is sent to the $1^{st}$ format converter 35. In the Q channel 41, the bit stream from the output of switch S3 directly enters the $2^{nd}$ format converter 36. In both format converters 35 and 36, bits are mapped into 2-bit symbols according to the rule: 1→−1 and 0→1.

The stream of 2-bit symbols generated at the output of the $1^{st}$ format converter 35 enters the pulse-shaping LPF 38 in the I channel 39 (see FIG. 10e), and the stream of 2-bit symbols generated at the output of the $2^{nd}$ format converter 36 enters the pulse-shaping LPF 40 in the Q channel 41 (see FIG. 10f). The signals at the inputs of the LPFs 38 and 40 in the I and Q channels 39 and 41 are respectively the I and Q components of a complex-valued baseband digital signal corresponding to input data. In the data transmission mode, the pulse-shaping LPFs 38 and 40 in the I and Q channels 39 and 41 operate exactly the same way as in the synchronization mode.

As demonstrated by the timing diagrams in FIGS. 10e and 10f, changes of the symbol polarity at any boundary between adjacent symbols can happen only in one of quadrature channels (in the I channel 39 or in the Q channel 41). Therefore, phase transitions between adjacent complex-valued symbols can be only +90° or −90°, and 180° phase transitions between these symbols are impossible. The signal constellation shown in FIG. 9 corresponds both to the synchronization and the data transmission modes in the $2^{nd}$ embodiment of the invention shown in FIG. 7.

Since only +90° or −90° gradual phase transitions between adjacent symbols are possible during both synchronization and data transmission modes, the $2^{nd}$ embodiment enables the same efficient utilization of the transmitter power as the $1^{st}$ embodiment. At the same time, the data is transmitted using binary phase differences between symbols of the same parity. These differences can be only 0° or 180°. Therefore, both $1^{st}$ and $2^{nd}$ embodiments of sync sequence generation and modulation have equally high noise immunity in the AWGN channels in addition to efficient utilization of transmitter power. At the same time, the $2^{nd}$ embodiment requires fewer gates for its realization than the $1^{st}$ embodiment (compare block diagrams in FIG. 3 and FIG. 7).

Comparison of the signal constellations in FIGS. 5 and 9 shows that the signal constellation corresponding to the $2^{nd}$ embodiment can be shifted by ±45° or ±135° relative to the constellation of the $1^{st}$ embodiment. Since propagation of radio waves in any communication channel always introduces a certain phase shift in the transmitted signal, a rotation in the signal constellation about any angle has no impact on the receiver design and communication system performance.

The $3^{rd}$ Embodiment of Sync Sequence Generation and Modulation

The $3^{rd}$ embodiment of sync sequence generation and modulation is much closer to the $2^{nd}$ embodiment than to the $1^{st}$ one. In both $2^{nd}$ and $3^{rd}$ embodiments, phase transitions between adjacent symbols are limited to ±90° due to elimination of simultaneous transitions of the symbols' polarity in the I and Q channels, while all symbols are processed in both I and Q channels. The $3^{rd}$ embodiment carries out joint differential encoding of the same parity input data bits for the I and Q channels 39 and 41 exactly like the $2^{nd}$ embodiment. At the same time, there are the following differences between the $2^{nd}$ and $3^{rd}$ embodiments. The $3^{rd}$ embodiment performs joint format conversion of the sync sequence and differentially encoded input data bits for the I and Q channels, while the $2^{nd}$ embodiment performs separate format conversion for these channels. In the $3^{rd}$ embodiment, the SAOZ is applied to one of the quadrature channels after its conversion to 2-bit format, while it is applied to the channel in binary format in the $2^{nd}$ embodiment.

The block diagram that illustrates operation of the sync sequence generator and modulator 22 of the $3^{rd}$ embodiment is shown in FIG. 11. Similar to the block diagrams shown in FIGS. 3 and 7, this block diagram contains an FEC encoder 20 and an input block 23 to the TX signal path 24 (the input block 23 forms a real-valued bandpass digital signal as in FIG. 3) in addition to the sync sequence generator and modulator 22. Transition from the synchronization mode to the data transmission mode is provided by switch S3 operated by a control unit 25, as in the $2^{nd}$ embodiment. In the $3^{rd}$ embodiment, all the operations carried out by units preceding switch S3 are the same and performed in the same order as in the $2^{nd}$ embodiment. Comparison of the block diagrams shown in FIGS. 7 and 11 confirms this.

The timing diagrams illustrating operation of the $3^{rd}$ embodiment in the synchronization mode are shown in FIGS. 12a-12j. The real-valued binary sync sequence at the outputs of the adder 51 and switch S3 is formed in the $3^{rd}$ embodiment exactly the same way as in the $2^{nd}$ embodiment. Therefore, the timing diagrams in FIGS. 12a to 12g coincide with the timing diagrams in FIGS. 8a to 8g. However, further processing in the $3^{rd}$ embodiment differs from that in the $2^{nd}$ embodiment.

In the $3^{rd}$ embodiment, the SAOZ from the direct output O of the SAOZ generator enters the $1^{st}$ format converter 35 before being sent to the I channel 39, and the binary sync sequence enters the $2^{nd}$ format converter 36 before being sent to both I and Q channels 39 and 41. In both format converters 35 and 36, bits are mapped into 2-bit symbols according to the rule: 1→−1 and 0→1. The stream of 2-bit symbols at the outputs of the $1^{st}$ format converter 35 is shown in FIG. 12h.

The stream of 2-bit symbols from the output of the $2^{nd}$ format converter 36 that corresponds to the sync sequence enters a multiplier 60 in the I channel 39 and the LPF 40 in the Q channel 41. The I component of the complex-valued baseband digital signal corresponding to the sync sequence is formed as a result of multiplying the 2-bit symbols from the output of the $2^{nd}$ format converter 36 by the 2-bit symbols from the output of the $1^{st}$ format converter 35. The I component is shown in FIG. 12i. It enters the LPF 38 in the I channel 39. The Q component of the complex-valued baseband digital signal corresponding to the sync sequence is the 2-bit symbol stream from the output of the $2^{nd}$ format converter 36 that enters the LPF 40 in the Q channel 41. This 2-bit symbol stream is shown in FIG. 12j. In the $3^{rd}$ embodiment, the LPFs 38 and 40 carry out the same functions as the LPFs 38 and 40 in the $1^{st}$ and $2^{nd}$ embodiments.

The I component of the complex-valued baseband digital signal (see FIG. 12i) is a product of the multiplication of the signal Q component (see FIG. 12j) by the 2-bit symbols corresponding to the SAOZ from the direct output O of the SAOZ generator 37 (see FIG. 12h). The Q component of the complex-valued baseband digital signal (see FIG. 12j) can be considered a product of the multiplication of the I signal component (see FIG. 12i) by the 2-bit symbols corresponding to the SAOZ from the direct output O of the SAOZ generator 37 (see FIG. 12h). This confirms the fact that, in principle, multiplying the 2-bit symbols from the output of the $2^{nd}$ format converter 36 by the 2-bit symbols from the output of the $1^{st}$ format converter 35 can be performed in any of the quadrature channels.

The timing diagram shown in FIG. 12i is the same as that shown in FIG. 8i, and the timing diagram shown in FIG. 12j is the same as that shown in FIG. 8j. Since these diagrams are identical, the signal constellations for the $2^{nd}$ and $3^{rd}$ embodiments are also identical. Taking into account that signal processing in the TX signal path 24 is the same for all three embodiments, the conclusion can drawn that only ±90° gradual phase transitions between adjacent symbols are possible in the bandpass signal corresponding to the sync sequence at the transmitter output. This enables efficient utilization of the transmitter power.

The timing diagrams illustrating operation of the $3^{rd}$ embodiment in the data transmission mode are shown in FIGS. 13a to 13f. During this mode, the $1^{st}$ and $2^{nd}$ PN sequences are not generated, and the encoded data from the output of the FEC encoder 20 enter the sync sequence generator and modulator 22 with bit rate R (see FIG. 13a). The modulator input data are differentially encoded exactly as in the $2^{nd}$ embodiment (see FIG. 13b), and the same SAOZ from the direct output O of the SAOZ generator 37 (see FIG. 13c) is used for further processing. Therefore, the timing diagrams in FIGS. 13a, 13b, and 13c coincide with the timing diagrams in FIGS. 10a, 10b, and 10c, respectively.

Consequently, in the $2^{nd}$ and $3^{rd}$ embodiments, the same bit stream of differentially encoded modulator input data passes through switch S3 during the data transmission mode. In the $3^{rd}$ embodiment, the differentially encoded input data during the data transmission mode are processed exactly the same way as the sync sequence during the synchronization mode. Thus, processing of the differentially encoded input data is different in the $2^{nd}$ and $3^{rd}$ embodiments. The stream of 2-bit symbols at the output of the $1^{st}$ format converter 35 that corresponds to the SAOZ from the direct output of the SAOZ generator 37 is shown in FIG. 13d. The I component of the complex-valued baseband digital data signal at the input of the LPF 38 in the I channel 39 is obtained as a result of multiplying 2-bit symbols from the outputs of the $1^{st}$ and $2^{nd}$ format converters 35 and 36 in the multiplier 60. This component is shown in FIG. 13e. The Q component of the complex-valued baseband digital data signal at the input of the LPF 40 in the Q channel 41 is the output signal of the $2^{nd}$ format converter 36. This component is shown in FIG. 13f.

The timing diagram shown in FIG. 13e is identical to the diagram shown in FIG. 10e, and the timing diagram shown in FIG. 13f is identical to the diagram shown in FIG. 10f. The identities of the timing diagrams shown in FIGS. 10e and 13e and FIGS. 10f and 13f, as well as the identity of the timing diagrams shown in FIGS. 8i and 12i and FIGS. 8j and 12j prove that, although the $2^{nd}$ and $3^{rd}$ embodiments process signals differently after switch S3, they provide the same results.

These identities also confirm that the $2^{nd}$ and $3^{rd}$ embodiments have identical signal constellations and identical properties of the output signals. Comparison of the block diagrams shown in FIGS. 7 and 11 proves that the $2^{nd}$ and $3^{rd}$ embodiments provide equally simple realization.

Synchronization and Demodulation

As has been shown above, all three embodiments of modulation and sync sequence generation produce identical signals at the receiver input. Therefore, the same methods and apparatus for synchronization and demodulation can be used in the RX part 28 of the modem for any embodiment of the sync sequence generator and modulator 22.

FIG. 14 is a block diagram that illustrates the structure and operation of one example of the synchronizer and demodulator 30. In addition to the synchronizer and demodulator 30, FIG. 14 also shows the last block 65 of the RX signal path 26 and the FEC decoder 32. They are shown to clarify the succession of signal processing in the receiver RX. At the same time, as mentioned above, the proposed AQDBPSK demodulation can be combined with any method of decoding and with any architecture of the RX signal path 26.

Although there are many ways of signal processing in the RX signal path 26 and all of them are compatible with the invention, the most effective way for any type of modulation and demodulation is as follows. In the RX signal path 26, a received real-valued bandpass analog signal (summed with noise and interference from the communication channel) is amplified, filtered, and converted to an intermediate frequency (IF). As shown in FIG. 2, the beginning of each transmission corresponds to the sync sequence, and the rest of transmission corresponds to the encoded and modulated data. At the IF, the received signal is translated into the digital domain by an analog-to-digital converter (A/D). The real-valued digital bandpass signal from the A/D enters the last block 65 of the RX signal path 26. Block 65 digitally forms in-phase and quadrature components simultaneously converting the A/D output signal to zero frequency. This is achieved by multiplying the A/D output signal by sine and cosine whose frequencies are equal to the center frequency of the A/D output signal and filtering the products by two identical digital lowpass filters (LPFs) 70 and 71. The multiplications are performed by multipliers 67 and 68. As a result of the multiplications and filtering, the signal at the output of the block 65 is a complex-valued baseband digital signal. This signal represented by multibit samples of its I and Q components is an input signal of the synchronizer and demodulator 30.

During a synchronization mode, it is necessary to decide if there is a signal intended for this receiver and to accurately determine the end of the sync sequence. This information is sufficient for symbol and word synchronization because data transmission starts immediately after sync sequence, and the lengths of the symbols and code words are known at the receiver RX of the communication system.

The complex-valued digital signal from the output of block 65 is divided into two branches directly at the input of the synchronizer and demodulator 30. The first branch is comprised of a complex-valued matched filter 73, peak selector 75, and generator of clock pulses 77. This branch carries out identification of the sync sequence and synchronization. The second branch is comprised of all other blocks of the synchronizer and demodulator 30. The complex-valued digital signal can enter the $1^{st}$ and $2^{nd}$ delay elements 80 and 81, but it cannot penetrate further in the second branch until synchronization is completed because switches S10 and S11 disconnect all subsequent blocks from the outputs of the $1^{st}$ and $2^{nd}$ delay elements 80 and 81 at the beginning of reception.

Various synchronization techniques can be used in the invention. The fastest synchronization, which is usually required for burst transmissions, can be achieved by using a complex-valued matched filter 73. The filter 73 is matched to the sync sequence generated in the transmitter TX. Consequently, it can identify the sync sequence and its output signal reaches a maximum level exactly at the end of the sync sequence. In practice, however, determining an accurate position of the end of sync sequence is complicated by the fact that each symbol in the filter 73 is usually represented by relatively small number of samples to minimize the required speed of signal processing. Therefore, some kind of interpolation is required to accurately determine the end of sync sequence. This interpolation and accurate determining the position of the sample that corresponds to the end of sync sequence is performed by the peak selector 75. There are many known methods of these procedures and virtually any of them can be used in the invention.

When the end of sync sequence is determined, peak selector 75 sends control signals to the clock pulse generator 77, switches S10 and S11, and tracking system 97. These signals initiate demodulation mode of the synchronizer and demodulator 30. Immediately after receiving the control signal from the peak selector 75, the clock pulse generator 77 starts generating all clock pulses necessary for demodulation and decoding. The control signal sent to switches S10 and S11 causes the switches to connect the outputs of the $1^{st}$ and $2^{nd}$ delay elements 80 and 81 to the inputs of integrators 83 and 84, respectively, and they stay connected until the end of signal reception. The control signal sent to the tracking system 97 initializes its operation.

Connections provided by the switches S10 and S11 allow the complex-valued digital signal from the output of the block 65 to enter the integrators 83 and 84 after passing through the $1^{st}$ and $2^{nd}$ delay elements 80 and 81. The $1^{st}$ and $2^{nd}$ delay elements 80 and 81 are identical. They are necessary for compensation of the delay caused by signal processing in the peak selector 75. Signals that enter the integrators 83 and 84 are digital samples of the symbols that correspond to the received data. The integrators 83 and 84 carry out digital summing of the signal samples during the time $T_b$ equal to the symbol length. This summing is performed under control of the generator of clock pulses 77.

In the I channel, the output signal of the integrator 83 simultaneously enters a $2T_b$ delay element 87 and a first input of the multiplier 90. The output signal of the $2T_b$ delay element 87 enters a second input of the multiplier 90. The $2T_b$ delay element 87 and the multiplier 90 perform differential demodulation of same parity multibit symbols in the I channel. Denoting multibit symbols at the output of the integrator 83 by $i_k$ and multibit symbols at the output of the multiplier 90 by $\beta^i_k$, where k is a symbol number, we can describe the differential demodulation as follows:

$$\beta^i_1 = i_1, \beta^i_2 = i_2, \text{ and } \beta^i_k = i_k \times i_{k-2} \text{ for } k \geq 3.$$

To correctly process symbols $i_1$ and $i_2$, two ones have to be written in the $2T_b$ delay element 87 before the start of data demodulation.

In the Q channel, a $2T_b$ delay element 88 and a multiplier 91 process the output signal of the integrator 84 the same way as the $2T_b$ delay element 87 and the multiplier 90 process the output signal of the integrator 83 in the I channel. As a result, differential demodulation of same parity multibit symbols in the Q channel is also performed. Denoting multibit symbols at the output of the integrator 84 by $q_k$ and multibit symbols at the output of the multiplier 91 by $\beta^q_k$, where k is a symbol number, we can describe the differential demodulation as follows:

$$\beta^q_1 = q_1, \beta^q_2 = q_2, \text{ and } \beta^q_k = q_k \times q_{k-2} \text{ for } k \geq 3.$$

The output signals of the multipliers 90 and 91 are summed by an adder 93. The output signal of the adder 93 is $\alpha^*_k = \beta^i_k + \beta^q_k$. This signal enters a decision unit 95. When soft-decision demodulation is performed, the decision unit 95 forms a multibit output signal using sign and value of $\alpha^*_k$. When hard-decision demodulation is performed, the decision unit 95 forms a binary output signal $\alpha^*_k$ using only sign of $\alpha^*_k$. FIG. 14 illustrates the case when hard-decision demodulation is carried out. In any case, the output signal of the decision unit 95 is an output signal of the synchronizer and demodulator 30, and it enters the FEC decoder 32 where it is decoded. The demodulated and decoded output data are sent to line 16. The described above demodulation procedure is optimal because it provides the highest noise immunity that can be achieved by noncoherent demodulation of binary signals.

Tracking system 97 starts operation immediately after achieving synchronization. Its task is to maintain time alignment between incoming signal and generator of clock pulses 77. In principle, any existing tracking method can be used in the invention.

Thus, demodulation of the received AQDBPSK signals represented by its I and Q components is performed by separately integrating the signals during the time equal to the symbol length, and multiplying a current output signal of the integrator by the signal delayed by the time equal to the length of two modulator input bits in both I and Q channels, summing the products obtained in both channels, and making hard or soft decision about the received symbol based on the sign or sign and value of the sum.

The complex-valued matched filter 73 used for synchronization differs from the prior art. It contains two identical real-valued filters matched to the $1^{st}$ sequence, consisting of the selected in the modulator halves of the symbols corresponding to the $1^{st}$ PN sequence and spaces between the adjacent in time halves, and two real-valued filters matched to the $2^{nd}$ sequence, consisting of the selected in the modulator halves of the symbols corresponding to the $2^{nd}$ PN sequence and spaces between the adjacent in time halves. An input signal from the I channel (i.e. an output signal of the I channel of the RX signal path 26) enters simultaneously two real-valued finite impulse response (FIR) filters, one of which is matched to the $1^{st}$ sequence, consisting of the selected in the modulator halves of the symbols corresponding to the $1^{st}$ PN sequence and spaces between the adjacent in time halves, and the other of which is matched to the $2^{nd}$ sequence, consisting of the selected in the modulator halves of the symbols corresponding to the $2^{nd}$ PN sequence and spaces between the adjacent in time halves. Similarly, an input signal from the Q channel (i.e. an output signal of the Q channel of the RX signal path 26) enters simultaneously two additional real-valued FIR filters, one of which is matched to the $1^{st}$ sequence, consisting of the selected in the modulator halves of the symbols corresponding to the $1^{st}$ PN sequence and spaces between the adjacent in time halves, and another is matched to the $2^{nd}$ sequence, consisting of the selected in the modulator halves of the symbols corresponding to the $2^{nd}$ PN sequence and spaces between the adjacent in time halves. The real-valued matched filters can have various forms of realization, for example, direct or transposed forms.

A block diagram of an example of the complex-valued matched filter 73 with direct form of realization of real-valued matched FIR filters is shown in FIG. 15. Here, two real-valued matched filters, whose inputs are connected to the output of the I channel of the RX signal path 26, use the same I channel digital tapped delay line 100. Simultaneously, two real-valued matched filters, whose inputs are connected to the output of the Q channel of the RX signal path 26, use the same Q channel digital tapped delay line 101. The digital tapped delay lines 100 and 101 are identical and each of them consists of digital delay elements (for example, registers) 105. Each of the digital delay elements 105 provides delay equal to the sampling interval $T_s$. The distance between neighboring taps is equal the symbol length $T_b$. Thus, the number of the digital delay elements 105 between each pair of neighboring taps is equal to the ratio $T_b/T_s$. In the example of the complex-valued matched filter 73 shown in FIG. 15, $T_b/T_s=4$. This means that each symbol is represented by 4 samples, and 4 digital delay elements 105 should be placed between each pair of neighboring taps. All even taps of the digital tapped delay lines 100 and 101 (counting from left to right) belong to the filter matched to the $1^{st}$ sequence, consisting of the selected in the modulator halves of the symbols corresponding to the $1^{st}$ PN sequence and spaces between the adjacent in time halves, and all odd taps of these lines belong to the filter matched to the $2^{nd}$ sequence, consisting of the selected in the modulator halves of the symbols corresponding to the $2^{nd}$ PN sequence and spaces between the adjacent in time halves. In each tap of the digital tapped delay lines 100 and 101, a multiplier is installed. This multiplier multiplies the signal in the tap by coefficients of the $1^{st}$ or $2^{nd}$ sequences. The coefficients can be +1 or −1. Taps with coefficients equal to 0 are excluded. In FIG. 15, the multipliers 107 belonging to the filters matched to the $1^{st}$ sequence, consisting of the selected in the modulator halves of the symbols corresponding to the $1^{st}$ PN sequence and spaces between the adjacent in time halves, are reflected by squares with the value of the coefficient (+1 or −1) inside, and the multipliers 108 belonging to the filters matched to the $2^{nd}$ sequence, consisting of the selected in the modulator halves of the symbols corresponding to the $2^{nd}$ PN sequence and spaces between the adjacent in time halves, are reflected by circles with the value of the coefficient (+1 or −1) inside. Technically multipliers 107 and 108 are identical.

Thus, the complex-valued matched filter convolutes the in-phase component of the received synchronization sequence with the impulse responses of the first and second real-valued filters. The I component of the input signal of the complex-valued matched filter 73 passes over the digital tapped delay line 100 and its taps to the multipliers 107 and 108, where this component is multiplied by appropriate coefficients. The output signals of all the multipliers 107 connected to the I channel digital tapped delay line 100 are summed by the $1^{st}$ sequence adder 110, and the output signals of all the multipliers 108 connected to this line are summed by the $2^{nd}$ sequence adder 114.

The complex-valued matched filter 73 likewise convolutes the quadrature component of the received synchronization sequence with impulse responses of third and fourth real-valued filters. The Q component of the input signal of the complex-valued matched filter 73 passes over the digital tapped delay line 101 and its taps to the multipliers 107 and 108, where this component is also multiplied by appropriate coefficients. The output signals of all the multipliers 107 connected to the Q channel digital tapped delay line 101 are summed by the $1^{st}$ sequence adder 111, and the output signals of all the multipliers 108 connected to this line are summed by the $2^{nd}$ sequence adder 115. The outputs of the $1^{st}$ sequence adders 110 and 111 are the outputs of the filters matched to the $1^{st}$ sequence, and the outputs of the $2^{nd}$ sequence adders 114 and 115 are the outputs of the filters matched to the $2^{nd}$ sequence.

Signals from the output of the $1^{st}$ sequence adder 110 and from the output of the $2^{nd}$ sequence adder 115 are summed with the same signs by the adder 118. This forms the I component of the output signal of the complex-valued matched filter 73. Signals from the output of the $2^{nd}$ sequence adder 114 with inverted sign and from the output of the $1^{st}$ sequence adder 111 are summed by the adder 119. In other words, the signal from the output of the $2^{nd}$ sequence adder 114 is subtracted from the signal from the output of the $1^{st}$ sequence adder 111. This forms the Q component of the output signal of the complex-valued matched filter 73.

The I and Q components of the output signal of the complex-valued matched filter 73 (i.e. the output signals of the adders 118 and 119) are separately squared by multipliers 122 and 123 respectively. The squared components are summed by the adder 125. The output signals of the adder 125 are output signals of the complex-valued matched filter 73.

Thus, realization of the complex-valued matched filter 73 requires two identical real-valued filters matched to the $1^{st}$ sequence, consisting of the selected in the modulator halves of the symbols corresponding to the $1^{st}$ PN sequence and spaces between the adjacent in time halves, and two real-valued filters matched to the $2^{nd}$ sequence, consisting of the selected in the modulator halves of the symbols corresponding to the $2^{nd}$ PN sequence and spaces between the adjacent in time halves. One filter matched to the $1^{st}$ sequence and one filter matched to the $2^{nd}$ sequence is connected to the I channel input of the complex-valued matched filter 73, and another filter matched to the $1^{st}$ sequence and another filter matched to the $2^{nd}$ sequence is connected to the Q channel input of the complex-valued matched filter 73.

When a direct form of realization of real-valued matched FIR filters is employed, the same digital tapped delay line is used for both real-valued FIR filters in each of quadrature channels. This radically simplifies implementation of the invention.

Properties of the Proposed Methods and Apparatus

As follows from the description above, all three preferable embodiments of the modulation and sync sequence generation limit possible phase transitions between adjacent symbols to ±90° and make these transitions gradual (smooth). This enables efficient utilization of transmitter power because such transitions allow operation of all the amplifiers of the transmitter analog signal path including the power amplifier PA in energy efficient nonlinear mode without any significant regeneration of the signal spectrum side lobes.

Simultaneously, in all the embodiments, the modulator input data are transmitted by binary 0° and 180° phase differences between same parity modulator output symbols. Preferably, optimal noncoherent demodulation of the received same parity symbols is used. This provides high noise immunity of communications in the AWGN channels in addition to efficient utilization of transmitter power.

Further increases in overall energy efficiency of the communication system are attained due to two factors.

First, the proposed modulation method allows noise immune noncoherent demodulation that reduces synchronization time. Fast synchronization significantly lowers energy consumption during burst transmissions.

Second, methods of modulation, noncoherent demodulation, and synchronization employed in the system can easily be realized using the simplest digital signal processing operations and the simplest digital circuits. These methods can easily be implemented in a universal reconfigurable digital modem. This enables significant reduction of power consumption in real world applications.

In addition, entirely digital realization of the method and apparatus make them resistant to all destabilizing factors and simplifies their practical implementation, and fast and reliable synchronization increases time allocated for data transmission when transmission time is limited.

The principles of modulation, demodulation, and synchronization disclosed herein are applicable to communications using any form of physical information carrier, including, but not limited to, those used in radio frequency or optical communications

REFERENCES

[1] B. Sklar, Digital Communications, Fundamentals and Applications, second edition, Prentice Hall PTR, Upper Saddle River, N.J., 2001.
[2] J. G. Proakis, Digital Communications, fourth edition, McGraw-Hill, Upper Saddle River, N.Y., 2001.
[3] Fuqin Xiong, Digital Modulation Techniques, Artech House, Boston/London, 2000.

[4] E. A. Lee and D. G. Messerschmitt, Digital Communications, second edition, Kluwer Academic Publishers, Boston/Dordrecht/London, 2001.

[5] H. Yazdani, K. Feher, and W. Steenaart, FBPSK, "Constant Envelope Bandlimited BPSK Signal." *IEEE Transaction on Communication*, vol. COM-28, No. 6, pp. 889-897, June 1980.

[6] U.S. Pat. No. 5,148,127. Int. Cl.$^5$ H04L 27/20. U.S. Cl. 332/104; 375/55; 375/67. Date of Patent: Sep. 15, 1992. Byoung-Jin Cheon, "Biphase Shift Keying Modulation Circuit Having Constant Envelope Characteristics."

[7] U.S. Pat. No. 5,491,457. Int. Cl.$^6$ H03C 3/00; H04L 27/12; H04L 27/20. U.S. Cl. 332/103; 332/100; 375/302; 375/305. Date of Patent: Feb. 13, 1996. Kamilo Feher, F-Modulation Amplification.

[8] H. Mehdi and K. Feher, "FBPSK, Power and Spectrally Efficient Modulation for PCS and Satellite Broadcasting Applications," *IEEE Transaction on Broadcasting*, vol. 42, No. 1, pp. 27-32, March 1996.

The Title, Technical Field, Background, Summary, Brief Description of the Drawings, Detailed Description, and Abstract are meant to illustrate the preferred embodiments of the invention and are not in anyway intended to limit the scope of the invention. The scope of the invention is solely defined and limited in the claims set forth below. It is intended, however, that the claims not be limited to any particular form of electronic implementation. For example, any one or combination of hardware, software, and/or firmware can be used to implement the claimed invention. Also although digital circuitry is preferred, analog circuitry may be used in all or any part of specific implementations within the scope of the claims.

The invention claimed is:

1. A method of operating a modulator by performing alternating quadratures differential binary phase shift keying modulation, comprising the steps of:
   limiting phase changes between adjacent in time output symbols produced by the modulator to ±90°; and
   transmitting data input to the modulator by 0° and 180° phase differences between non-adjacent in time output symbols produced by the modulator.

2. The method of claim 1, further comprising the steps of:
   separating modulator input data bits into first and second parity modulator input data bits;
   converting the first and second parity modulator input data bits into 2-bit symbols;
   sending the 2-bit symbols corresponding to the first parity input data bits to an in-phase channel and the 2-bit symbols corresponding to the second parity modulator input data bits to a quadrature channel;
   performing differential polarity modulation of the 2-bit symbols corresponding to the first parity modulator input data bits in an in-phase channel and the 2-bit symbols corresponding to the second parity modulator input data bits in a quadrature channel and obtaining differentially modulated 2-bit symbols in both in-phase and quadrature channels; and
   performing interpolating and pulse shaping digital filtering of the differentially modulated 2-bit symbols in both in-phase and quadrature channels.

3. The method of claim 1, further comprising the steps of:
   converting modulator input data bits into 2-bit symbols;
   separating first and second parity 2-bit symbols;
   sending the first parity 2-bit symbols to an in-phase channel and the second parity 2-bit symbols to a quadrature channel;
   performing differential polarity modulation of the first parity 2-bit symbols in an in-phase channel and the second parity 2-bit symbols in a quadrature channel and obtaining differentially modulated 2-bit symbols in both in-phase and quadrature channels; and
   performing interpolating and pulse shaping digital filtering of the differentially modulated 2-bit symbols in both in-phase and quadrature channels.

4. The method of claim 1, further comprising the steps of:
   differentially encoding same parity bits in a modulator input data stream;
   sending the differentially encoded data bits to both in-phase and quadrature channels;
   converting the differentially encoded data bits into 2-bit symbols in one of the channels;
   modulo 2 adding a sequence of alternating ones and zeros to the differentially encoded data bits in the other channel;
   converting the modulo 2 sums into 2-bit symbols; and
   performing interpolating and pulse shaping digital filtering of the 2-bit symbols in both in-phase and quadrature channels.

5. The method of claim 1, further comprising the steps of:
   differentially encoding same parity bits in a modulator input data stream;
   converting the differentially encoded data bits into 2-bit symbols;
   converting the bits of a sequence of alternating ones and zeros into 2-bit symbols;
   sending 2-bit symbols corresponding to the differentially encoded input bits to both in-phase and quadrature channels;
   multiplying the 2-bit symbols corresponding to the differentially encoded input bits by the 2-bit symbols corresponding to the sequence of alternating ones and zeros and obtaining 2-bit products in one of the channels;
   performing interpolating and pulse shaping digital filtering of the 2-bit products in the channel where the multiplication is carried out; and
   performing interpolating and pulse shaping digital filtering of the 2-bit symbols corresponding to the differentially encoded input bits in the other channel.

6. The method of claim 2, in which the step of performing differential polarity modulation in each channel comprises the step of:
   multiplying input 2-bit symbols of a differential polarity modulator by its output 2-bit symbols that are delayed by the time equal to the length of two modulator input bits.

7. The method of claim 3, in which the step of performing differential polarity modulation in each channel comprises the step of:
   multiplying input 2-bit symbols of a differential polarity modulator by its output 2-bit symbols that are delayed by the time equal to the length of two modulator input bits.

8. The method of claim 4, in which the differential encoding step comprises the step of:
   modulo 2 summing the differential encoder input bits and its output bits delayed by the time equal to the length of two modulator input bits.

9. The method of claim 5, in which the differential encoding step comprises the step of:
   modulo 2 summing the differential encoder input bits and its output bits delayed by the time equal to the length of two modulator input bits.

10. A method of operating a demodulator, comprising the steps of:

receiving in the demodulator first and second parity modulated input signals, the phase shift between adjacent in time different parity modulated input signals being limited to ±90° and the phase difference between adjacent in time same parity modulated input signals being 0° or 180°; and producing output data from the demodulator in response to the phase differences between same parity modulated input signals.

11. A method of noncoherent demodulation of alternating quadratures differential binary phase shift keying signals, in accordance with claim 10, in which the producing step comprises the steps of:

forming in-phase and quadrature components of a received signal;

separately integrating in-phase and quadrature components of this signal during the time equal to the length of the modulator input data bit;

differentially demodulating the same parity input symbols by separate multiplying a current output signal of each integrator by its output signal delayed by the time equal to the length of two modulator input bits in the in-phase and quadrature channels of a receiver;

summing the products obtained in the in-phase and quadrature channels; and making a hard decision about a received symbol by utilizing only the sign of the sum or a soft decision about the received symbol by utilizing both sign and value of the sum.

* * * * *